(12) United States Patent
Kawashima et al.

(10) Patent No.: US 7,442,428 B2
(45) Date of Patent: *Oct. 28, 2008

(54) GAS BARRIER SUBSTRATE

(75) Inventors: Sayaka Kawashima, Tokyo (JP);
Minoru Komada, Tokyo (JP); Keiji Tokunaga, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/595,769

(22) Filed: Nov. 10, 2006

(65) Prior Publication Data

US 2007/0059491 A1 Mar. 15, 2007

Related U.S. Application Data

(63) Continuation of application No. 10/810,541, filed on Mar. 26, 2004, now Pat. No. 7,229,703.

(30) Foreign Application Priority Data

Mar. 31, 2003 (JP) ............................. 2003-094546
Mar. 31, 2003 (JP) ............................. 2003-094564

(51) Int. Cl.
*G11B 5/64* (2006.01)
*B32B 3/00* (2006.01)

(52) U.S. Cl. .................. 428/141; 428/156; 428/690; 428/917

(58) Field of Classification Search ................ 428/690, 428/917; 313/504, 506; 257/40
See application file for complete search history.

(56) References Cited

U.S. PATENT DOCUMENTS

| 6,262,579 | B1 * | 7/2001 | Chazan et al. ............... 324/537 |
| 7,229,703 | B2 * | 6/2007 | Kawashima et al. ......... 428/690 |
| 2002/0176993 | A1 * | 11/2002 | Graff et al. | |

FOREIGN PATENT DOCUMENTS

| JP | 2004-223785 A | * | 8/2004 |
| JP | 2004-244606 A | * | 9/2004 |
| JP | 2004307851 A | * | 11/2004 |
| WO | 01/082336 A3 | * | 11/2001 |

* cited by examiner

*Primary Examiner*—Dawn Garrett
(74) *Attorney, Agent, or Firm*—Ladas & Parry LLP

(57) ABSTRACT

The main object of the present invention is to provide a gas barrier substrate having a high gas barrier property without a ruggedness, a pin hole or the like in the gas barrier layer. The present invention solves the problem by providing a gas barrier substrate having a base material, a planarization layer formed on the base material, and a gas barrier layer comprising a deposition film formed on the planarization layer.

7 Claims, 1 Drawing Sheet

GAS BARRIER SUBSTRATE

PRIORTY CLAIM

This application is a continuation of, claims priority to and the benefit of U.S. patent application Ser. No. 10/810,541 filed on Mar. 26, 2004 now U.S. Pat. No. 7,229,703, the entire contents of which are incorporated herein.

BACKGROUND OF THE INVENTION

1. Field of the Invention

The present invention relates to a gas barrier substrate having a high gas barrier property and a flatness, to be used for a display substrate such as an organic electroluminescent (hereinafter it may abbreviated as organic EL) device or the like.

2. Description of the Related Art

Conventionally, for example, as a supporting substrate for a display substrate such as an organic EL display, those using a glass substrate are known. However, the glass substrates have shortcomings of heaviness, hardness and easily crackable. Then, recently, in order to solve the problems of the glass substrates, a plastic substrate has been proposed.

However, although the plastic substrates are light-weight, flexible and hardly crackable, they have a poorer gas barrier property compared with the glass substrates so that it has been difficult to maintain the performance of the display device for a long time.

Moreover, for example, when a supporting substance is used for a display device such as an organic EL device, the gas barrier property to oxygen or water vapor is required, because the light emission deterioration occur when a light emitting layer of the organic EL device contact with a water vapor or oxygen. Moreover, since the process under a high temperature is necessary to form an organic EL device, the heat resistance is also required for the supporting substrate. Moreover, when the supporting substrate does not have enough flatness, a defect can be generated in the gas barrier property due to a pin hole, a projection or the like, or since the organic EL layer such as the light emitting layer is a thin film, the organic EL layer cannot be formed evenly due to a pin hole, a projection or the like so that a dark spot is considered to be generated in the organic EL display. Moreover, when the display is installed and used for a long time, the supporting substrate is required to be stable to the electric potential and the temperature rise. This is because a problem of the modulation of the light emission or the light of the display can be generated when the supporting substrate is unstable to the electric potential or the temperature rise. In view of these points, a method of providing the properties to the plastic substrate has been required.

Therefore, conventionally, for providing the gas barrier property to a plastic substrate, the following proposal has been provided. For example, according to Japanese Patent Application Laid-Open (JP-A) No. 7-164591, a high gas barrier property is achieved by providing an inorganic deposition film as the first layer on a substrate made of a polymer resin composition, and laminating, as the second layer, a gas barrier property film produced by applying a coating agent containing, as the main agent, an aqueous solution including one or more kinds of an alkoxide and/or a hydrolyzed product thereof, and a tin chloride, or a water/alcohol mixture solution, heating and drying.

Moreover, according to JP-A No. 7-268115, a high gas barrier property is achieved by providing an inorganic deposition film as the first layer on a substrate made of a polymer resin composition, and laminating, as the second layer, a gas barrier property film produced by applying a coating agent containing, as the main agent, a mixture solution of one or more kinds of an alkoxide or a hydrolyzed product thereof, and an isocyanate compound having at least two isocyanate groups in the molecule, heating and drying.

Moreover, according to JP-A No. 11-222508, a gas barrier property is achieved by providing an inorganic deposition film made of a $SiO_2$ on a substrate having the excellent heat resistance, mechanical strength, and in particular, shock resistance by including a component containing an alicyclic hydrocarbon skeleton bis (meth)acrylate, a mercapto compound, and a monofunctional (meth)acrylate).

However, according to JP-A Nos. 7-164591, 7-268115, the application is limited to the packaging field such as the food and the medical products. Furthermore, as to the gas barrier property, the water vapor transmission rate (hereinafter it is referred to also as the WVTR) is about 0.1 $g/m^2$/day, and the oxygen transmission rate (hereinafter it is referred to also as the OTR) is about 0.3 $cc/m^2$/day·atm, and thus it is insufficient. Moreover, according to JP-A No. 11-222508, its application is in the display field, in particular, the liquid crystal display panel. Although the gas barrier property is achieved by providing an inorganic deposition film made of a $SiO_2$ on a substrate, the oxygen transmission rate remains at 1 $cc/m^2$/day·atm so that it is not sufficient as the water proof property for preventing deterioration of, for example, the light emitting layer of the organic EL device.

Moreover, as to the surface flatness, it is not discussed in any of the patent documents.

Furthermore, recently, when using a glass substrate as a thin film, improvement of the gas transmission rate is required in accordance with the high precision of the organic EL display.

SUMMARY OF THE INVENTION

The present invention has been achieved in view of the above-mentioned problems, and the main object thereof is to provide a gas barrier substrate having a high gas barrier property and a good flatness without a ruggedness, a pin hole or the like in the gas barrier layer.

In order to achieve the above-mentioned object, the present invention provides a gas barrier substrate having a base material, a planarization layer formed on the base material, and a gas barrier layer comprising a deposition film formed on the planarization layer.

According to the present invention, since the gas barrier layer is formed on the flattened surface of the planarization layer, the gas barrier layer can be a dense layer having a high gas barrier property without a ruggedness, a pin hole or the like. Moreover, since the planarization layer is formed between the gas barrier layer and the transparent base material, the adhesive property between the transparent base material and the gas barrier layer can be improved so that a gas barrier substrate having a high gas barrier property can be provided. Thereby, a high quality display without a dark spot can be formed by using the gas barrier substrate of the present invention, for example, as a display substrate.

In the present invention, it is preferable that the planarization layer has a cardo polymer. Since the cardo polymer in general has a high adhesive property with the gas barrier layer, the gas barrier layer can be absorbed on the entirety of the planarization layer so that a gas barrier substrate having a high gas barrier property with the gas barrier layer formed more densely can be provided.

Moreover, according to the present invention, it is possible that the base material is made of a heat resistant transparent resin having a 80 ppm or less of coefficient of thermal expansion in the range from a room temperature to 150° C. and 85% or more of overall optical transmittance. Thereby, the gas barrier substrate of the present invention has the heat resistance to be used for the various applications such as a display substrate, which is required to have the heat resistance like an organic EL device.

Furthermore, according to the present invention, it is possible that the base material has a heat resistant transparent resin layer having a 80 ppm or less of coefficient of thermal expansion in the range from a room temperature to 150° C. and 85% or more of overall optical transmittance on the surface. Since the base material have the heat resistance owing to the transparent resin layer, the gas barrier substrate of the present invention can be used for the various applications.

Moreover, according to the present invention, it is preferable that the average surface roughness of the planarization layer is 6 nm or less, and the maximum height difference of surface (peak to valley) is 60 nm or less. Thereby, a high quality gas barrier substrate having a high flatness without a ruggedness, a pin hole or the like in the gas barrier layer formed on the planarization layer or in a layer formed on the gas barrier substrate of the present invention or the like can be provided.

Furthermore, according to the present invention, it is preferable that the gas barrier layer is a deposition film comprising a transparent inorganic oxide film, a transparent inorganic oxide nitride film, a transparent inorganic nitride film or a transparent metal film. Thereby, the gas barrier property of the gas barrier layer can be made higher.

Moreover, according to the present invention, it is preferable that the oxygen transmission rate in the gas barrier substrate is 0.3 cc/m$^2$/day·atm or less and the water vapor transmission rate is 0.1 g/m$^2$/day or less. Since the oxygen transmission rate and the water vapor transmission rate of the gas barrier substrate of the present invention are in the ranges, it can be used for a supporting substrate of, for example, an organic EL device or the like having a member vulnerable to the oxygen, the water vapor or the like.

Furthermore, according to the present invention, it is preferable that the average surface roughness of the gas barrier substrate is 6 nm or less, and the maximum height difference of surface (peak to valley) is 60 nm or less. By the flatness in the surface of the gas barrier substrate, it can be used for various applications such as a display substrate for an organic EL device.

Moreover, in the above-mentioned invention, it is possible that a stress releasing layer for releasing the stress applied on the base material is formed on the opposite surface where the gas barrier layer and the planarization layer are formed. Thereby, the stress generated when forming the gas barrier layer or the planarization layer can be reduced so that warpage in the gas barrier substrate can be prevented.

The present invention provides a gas barrier substrate having a base material, a gas barrier layer comprising a deposition film formed on the base material, and a planarization layer having a cardo polymer, formed on the gas barrier layer.

According to the present invention, since the planarization layer has a high adhesive property to the gas barrier layer so that it can fill a pin hole of the gas barrier layer or the like, thereby a gas barrier substrate having a high gas barrier property can be provided. Moreover, since the planarization layer is formed on the surface of the gas barrier substrate, a gas barrier substrate having a flat surface can be provided so that a gas barrier substrate to be used for various applications such as an organic EL device can be provided.

In the above-mentioned invention, it is preferable that the gas barrier layer is formed on the planarization layer. Thereby, the gas barrier property of the gas barrier substrate can be made higher.

Moreover, according to the present invention, it is possible that the base material is made of a heat resistant transparent resin having 80 ppm or less of coefficient of thermal expansion in the range from a room temperature to 150° C. and 85% or more of overall optical transmittance. Thereby, the gas barrier substrate of the present invention has the heat resistance to be used for the various applications such as a display substrate, which is required to have the heat resistance like an organic EL device.

Furthermore, according to the present invention, it is possible that the base material has a heat resistant transparent resin layer having 80 ppm or less of coefficient of thermal expansion in the range from a room temperature to 150° C. and 85% or more of overall optical transmittance on the surface. Since the base material have the heat resistance owing to the transparent resin layer, the gas barrier substrate of the present invention can be used for the various applications.

Moreover, according to the present invention, it is preferable that the average surface roughness of the planarization layer is 6 nm or less, and the maximum height difference of surface (peak to valley) is 60 nm or less. Thereby, a high quality gas barrier substrate having a high flatness without a ruggedness, a pin hole or the like in the gas barrier layer formed on the planarization layer or in a layer formed on the gas barrier substrate of the present invention or the like can be provided.

Furthermore, according to the present invention, it is preferable that the gas barrier layer is a deposition film comprising a transparent inorganic oxide film, a transparent inorganic oxide nitride film, a transparent inorganic nitride film or a transparent metal film. Thereby, the gas barrier property of the gas barrier layer can be made higher.

Moreover, according to the present invention, it is preferable that the oxygen transmission rate in the gas barrier substrate is 0.3 cc/m$^2$/day·atm or less and the water vapor transmission rate is 0.1 g/m$^2$/day or less. Since the oxygen transmission rate and the water vapor transmission rate of the gas barrier substrate of the present invention are in the ranges, it can be used for a supporting substrate of, for example, an organic EL device or the like having a member vulnerable to the oxygen, the water vapor or the like.

Furthermore, according to the present invention, it is preferable that the average surface roughness of the gas barrier substrate is 6 nm or less, and the maximum height difference of surface (peak to valley) is 60 nm or less. Since the flatness in the surface of the gas barrier substrate is in the ranges, it can be used for various applications such as a display substrate for an organic EL device.

Moreover, in the above-mentioned invention, it is possible that a stress releasing layer for releasing the stress applied on the base material is formed on the opposite surface where the gas barrier layer and the planarization layer are formed. Thereby, the stress generated when forming the gas barrier layer or the planarization layer can be reduced so that warpage in the gas barrier substrate can be prevented.

The present invention provides an organic EL device substrate comprising a color conversion layer formed between the base material and the planarization layer of the gas barrier substrate.

According to the present invention, since the gas barrier layer is formed on the planarization layer, the gas barrier layer can be a dense layer having a high gas barrier property without a ruggedness, a pin hole or the like. Moreover, since the planarization layer is formed between the gas barrier layer and the base material or the color conversion layer, the adhesive property between the gas barrier layer and the base material or the like can be improved so that an organic EL device substrate having a high gas barrier property can be provided. Thereby, when forming an organic EL layer on the organic EL device substrate of the present invention, invasion of oxygen, water vapor or the like generated from the color conversion layer can be prevented so that a high quality organic EL device substrate without generation or growth of a dark spot or the like can be provided.

In the above-mentioned invention, it is preferable that a planarization coating layer is formed on the gas barrier layer of the gas barrier substrate. Thereby, since the surface of the organic EL device substrate can be made further flattened so that an organic EL layer without a ruggedness, a pin hole or the like can be formed on the organic EL device substrate of the present invention, an organic EL device substrate for a high quality organic EL device can be provided.

Moreover, according to the present invention, it is preferable that the planarization coating layer has a cardo polymer. Thereby, an organic EL device substrate having a higher gas barrier property can be provided since the adhesive property between the planarization coating layer and the gas barrier layer is high, and a fine pin hole of the gas barrier layer is filled with the planarization coating layer.

Furthermore, according to the present invention, it is preferable that the average surface roughness of the planarization coating layer is 6 nm or less, and the maximum height difference of surface (peak to valley) is 60 nm or less. Thereby, the transparent electrode layer, the organic EL layer or the like to be used for the organic EL device can be formed flatly.

Moreover, according to the present invention, it is preferable that the average surface roughness of the organic EL device is 6 nm or less, and the maximum height difference of surface (peak to valley) is 60 nm or less. Thereby, when forming the organic EL layer on the organic EL device substrate of the present invention, one having a high quality without generation of a dark spot or the like can be provided.

Furthermore, according to the present invention, it is preferable that the oxygen transmission rate in the organic EL device substrate is 0.3 cc/m$^2$/day·atm or less, and the water vapor transmission rate is 0.1 g/m$^2$/day or less. Thereby, deterioration of the organic EL layer due to the time passage or the like can be prevented.

Moreover, according to the present invention, it is possible that a color filter layer is provided between the base material and the color conversion layer. Thereby, the color tone of the light emitted form the organic EL device can be adjusted.

The present invention provides an organic EL device substrate comprising a color conversion layer and an overcoat layer formed in this order on the base material and being between the base material of the gas barrier substrate and the gas barrier layer.

According to the present invention, an organic EL device substrate having a high gas barrier property can be provided since the adhesive property between the gas barrier layer and the planarization coating layer is high, and a fine pin hole of the gas barrier layer is filled with the planarization coating layer. Moreover, since the planarization layer is formed on the surface of the organic EL device substrate, an organic EL layer without a ruggedness, a pin hole or the like can be formed on the organic EL device substrate of the present invention so that an organic EL device substrate for a high quality organic EL device can be provided.

According to the above-mentioned invention, it is preferable that the average surface roughness of the organic EL device is 6 nm or less, and the maximum height difference of surface (peak to valley) is 60 nm or less. Thereby, when forming an organic EL layer on the organic EL device substrate, one having a high quality without generation of a dark spot or the like can be provided.

Moreover, according to the present invention, it is preferable that the oxygen transmission rate in the organic EL device substrate is 0.3 cc/m$^2$/day·atm or less, and the water vapor transmission rate is 0.1 g/m$^2$/day or less. Thereby, deterioration of the organic EL layer due to the time passage or the like can be prevented.

Furthermore, according to the present invention, it is possible that a color filter layer is provided between the base material and the color conversion layer. Thereby, the color tone of the light emitted form the organic EL device can be adjusted.

Moreover, the present invention provides a display substrate comprising a transparent electrode layer formed on the gas barrier substrate.

According to the present invention, by using the gas barrier substrate, a display substrate having the high gas barrier property and flatness can be provided to be used for various applications.

Furthermore, the present invention provides an organic EL display substrate comprising a transparent electrode layer formed on the organic EL device substrate.

According to the present invention, by using the organic EL device substrate, an organic EL display substrate having the high flatness and gas barrier property can be provided so that one having a high quality without breakage of the transparent electrode layer or the like can be provided.

The present invention provides an organic EL device having the organic EL display substrate, an organic EL layer comprising at least a light emitting layer formed on the transparent electrode layer, and a counter electrode formed on the organic EL layer.

According to the present invention, since the organic EL display substrate having the high gas barrier property and flatness is used, the organic EL layer can be formed evenly so that a high quality organic EL device can be provided without deterioration due to the time passage of the organic EL layer without generation or growth of a dark spot or the like.

DESCRIPTION OF THE PREFERRED EMBODIMENT

The present invention relates to a gas barrier substrate having the high gas barrier property and flatness to be used for a display substrate or the like, an organic EL device substrate and a display substrate using the gas barrier substrate, and an organic EL display substrate and an organic EL device using the organic EL device substrate.

A. Gas Barrier Substrate

Firstly, a gas barrier substrate of the present invention will be explained.

The gas barrier substrate of the present invention includes two embodiments. A first embodiment comprises a base material, a planarization layer formed on the base material, and a gas barrier layer comprising a deposition film formed on the planarization layer, and a second embodiment comprises a base material, a gas barrier layer comprising a deposition film formed on the base material, and a planarization layer having a cardo polymer formed on the gas barrier layer.

According to the present invention, in both embodiments, since the planarization layer is provided, a gas barrier substrate having a high gas barrier property can be provided. Moreover, the surface of the gas barrier substrate of the present invention has the flatness.

Hereinafter, each of the above-mentioned embodiments will be explained.

1. First Embodiment

Firstly, the first embodiment of the gas barrier substrate of the present invention will be explained. The first embodiment of the gas barrier substrate of the present invention comprises a base material, a planarization layer formed on the base material, and a gas barrier layer comprising a deposition film formed on the planarization layer.

Figure 1:
FIG. 1 is a schematic cross sectional view showing an example of a gas barrier substrate of the present invention.

The gas barrier substrate of this embodiment comprises a base material 1, a planarization layer 2 formed on the base material 1, and a gas barrier layer 3 formed on the planarization layer 2 as shown in FIG. 1.

According to this embodiment, since the gas barrier layer is formed on the planarization layer, the dense and flat gas barrier layer can be formed without the influence of the ruggedness or the projection of the base material. Thereby, the gas barrier property of the gas barrier layer can be made higher. Moreover, when the gas barrier substrate of this embodiment is used for a display substrate, one having a high quality without a dark spot formed by a pin hole of the gas barrier layer or the like can be provided.

Furthermore, since the surface flatness of the gas barrier substrate is high, even when a thin film of a light emitting layer of an organic EL device or the like is formed on the gas barrier substrate, the layer can be formed evenly so that a gas barrier substrate to be used for various applications can be provided.

Hereinafter, each configuration of the gas barrier substrate of this embodiment will be explained independently.

a. Planarization Layer

Firstly, the planarization layer used for the gas barrier substrate of this embodiment will be explained. The planarization layer used for the gas barrier substrate of this embodiment is a layer having a flatness formed between the base material to be described later and the gas barrier layer.

As to the flatness of the planarization layer used in this embodiment, it is preferable that the average surface roughness (Ra) is 6 nm or less, more preferably 3 nm or less, further preferably 2 nm or less, and much further preferably 1 nm or less. Moreover, it is preferable that the maximum height difference of surface (peak to valley) is 60 nm or less, more preferably 50 nm or less, further preferably 20 nm or less, and much further preferably 10 nm or less. Since the surface roughness and the maximum height difference of surface (peak to valley) are in the ranges, the gas barrier layer to be described later can be formed densely and flatly when it is formed on the planarization layer.

Here, the surface roughness and the maximum height difference of surface (peak to valley) are the values measured by using an atomic force microscope (Nanopics: product name, produced by Seiko Instruments Inc.) under the conditions of a 20 µm of scanning range and a 90 sec/frame of scanning speed.

According to this embodiment, although the material or the like of the planarization layer is not particularly limited as long as it is a layer having the flatness, it is preferable to use an organic product in this embodiment. Thereby, the layer having a flatness can be formed easily so that a planarization layer having a good adhesive property with the base material and the gas barrier layer to be described later can be provided.

Moreover, it is preferable that the planarization layer used in this embodiment has a cardo polymer. Thereby, the adhesive property between the planarization layer and the gas barrier layer can further be improved so as to form the gas barrier property more densely, and thus the gas barrier property of the gas barrier layer can be made higher.

As such a cardo polymer, for example, an epoxy resin derived from a bisphenol compound having a fluorene skeleton and an epichlorohydrin, an epoxy(meth)acrylate derived from the epoxy resin and a (meth) acrylic acid, an epoxy (meth)acrylate acid adduct derived from the epoxy(meth) acrylate and an acid anhydride or the like can be presented.

Here, it is preferable that the cardo polymer used in this embodiment contains a resin having a fluorene skeleton derived from a bisphenol compound represented by the below-mentioned general formula (1):

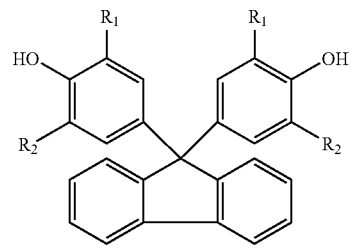

(wherein R1 and R2 are a hydrogen atom, an alkyl group having 1 to 5 carbon atoms, or a halogen atom, which may be same or different.)

As a bisphenol compound represented by the general formula (1), specifically, a 9,9-bis(4-hydroxy phenyl)fluorene, a 9,9-bis(4-hydroxy-3-methyl phenyl)fluorene, a 9,9-bis(4-hydroxy-3-chloro phenyl)fluorene, a 9,9-bis(4-hydroxy-3-bromo phenyl)fluorene, a 9,9-bis(4-hydroxy-3-fluoro phenyl)fluorene, a 9,9-bis(4-hydroxy-3-methoxy phenyl) fluorene, a 9,9-bis(4-hydroxy-3,5-dimethyl phenyl)fluorene, a 9,9-bis(4-hydroxy-3,5-dichloro phenyl)fluorene, a 9,9-bis (4-hydroxy-3,5-dibromo phenyl)fluorene or the like can be presented. These can be used alone by one kind or as a combination of two or more kinds.

In this embodiment, the cardo polymer is preferably an epoxy(meth)acrylate acid adduct derived from a polybasic acid anhydride and an epoxy(meth)acrylate resin obtained by the reaction of an epoxy resin having two or more epoxy groups in a molecule and an unsaturated monocarboxylic acid.

As the epoxy resin used for the formation of such an epoxy (meth)acrylate acid adduct, specifically, bisphenols such as a bis(4-hydroxyphenyl)ketone, a bis(4-hydroxyphenyl)sulfone, a 2,2-bis(4-hydroxyphenyl)propane, a bis(4-hydroxyphenyl)ether, a bis(4-hydroxyphenyl)hexafluoropropane, a 9,9-bis(4-hydroxyphenyl)fluorene, a bis(4-hydroxyphenyl) dimethylsilane and a 4,4'-biphenol, a tetramethyl-4,4'-biphenol, polyfunctional phenols such as a condensation compound obtained by reacting a 1,4-bisxylenol with a phenol novolak, a cresol novolak, naphthol or naphthalane diol, and those, having two or more epoxy groups in a molecule, obtained by reacting a polyfunctional phenol whose aromatic ring hydrogen was substituted partially or totally by a halogen atom, an alkyl group having 1 to 4 carbon atoms with an epichlorohydrin can be presented. By reacting the epoxy resins with the same equivalent amount of acrylic acids such as an acrylic acid and a methacrylic acid by a known method, an epoxy(meth)acrylate resin can be provided. Furthermore, by reacting the epoxy(meth)acrylate resin with a polybasic acid anhydride, an adduct product of the epoxy(meth)acrylate resin and the polybasic acid anhydride can be provided.

As the polybasic acid anhydride used for the formation of such an adduct product, specifically, alicyclic acid anhydrides such as a methyltetrahydrophthalic anhydride, a methylhexahydrophthalic anhydride, an anhydride methyl himic acid, a tetrahydrophthalic anhydride, a hexahydrophthalic anhydride, and a methylcyclohexene dicarboxylic anhydride, aromatic acid anhydrides such as a phthalic anhydride, a trimellitic anhydride, a pyromellitic anhydride, a benzophenonetetracarboxylic dianhydride, an ethyleneglycolbistrimellitate anhydride, a glyceroltristrimellitate anhydride, and a biphenyltetracarboxylic dianhydride, halogen based acid anhydrides such as an anhydride hetic acid, and a tetrabromophthallic anhydride or the like can be presented. Moreover, the epoxy resins, acrylate and acid anhydrides can be used by one kind or as a mixture of two or more kinds.

Among the epoxy(meth)acrylate acid adducts obtained accordingly, in this embodiment, it is preferable that a resin having a 1,000 or more weight average molecular weight comprising a carboxyl group and a photopolymerizable unsaturated group in the same molecule is contained in the planarization layer as it is disclosed in JP-A Nos. 60-152091, 6-1938 and 8-146311. Specifically, an acid adduct of an epoxy acrylate having a fluorene skeleton, V259M, V301M produced by Nippon Steel Chemical Co., Ltd., and an acid adduct of a cresol novolak type epoxy acrylate produced by Nippon Kayaku Co., Ltd. can be presented.

As the epoxy acrylate having a fluorene skeleton, those obtained by reacting acrylic acids with an epoxy resin obtained from a 9,9-bis(4-hydroxy phenyl)fluorene can be used preferably.

According to this embodiment, the resin comprising the planarization layer may be a thermosetting resin, an ultraviolet ray hardening type resin, or a thermally ultraviolet ray hardening type resin. Here, when the resin is a thermally ultraviolet ray hardening type resin, it is preferable that the average molecular weight is 3,000 or more since the softening point can be made 45° C. or higher.

The composition of the planarization layer is not particularly limited as long as it has the flatness as mentioned above. In this embodiment, it can be formed by, for example, mixing a resin having the cardo polymer, a polyfunctional acrylate monomer, a photopolymerization initiating agent or a thermally polymerization initiating agent, an epoxy resin having two or more epoxy groups in a molecule, and as needed various kinds of additives, coating the same on the color conversion layer and hardening the same by the ultraviolet ray, the heat or the like. When the resin is an ultraviolet ray hardening type resin, a photopolymerization initiating agent is used, and when the resin is a thermosetting type resin, a thermally polymerization initiating agent is used.

Here, as the polyfunctional acrylate used in this embodiment, specifically, an addition polymerization compound having a boiling point of 100° C. or higher at an ordinary pressure, and at least two ethylenically unsaturated groups in a molecule can be presented. As such a material, those obtained by coupling a polyhydric alcohol and an $\alpha,\beta$-unsaturated carboxylic acid, for example, polyfunctional acrylates or corresponding polyfunctional methacrylate such as a diethylene glycol (meth)acrylate (It denotes a diacrylate or a dimethacrylate. The same is also applied hereinafter.), a triethylene glycol di(meth)acrylate, a tetraethylene glycol di(meth)acrylate, a trimethylol propane di(meth)acrylate, a trimethylol propane di(meth)acrylate, a trimethylol propane tri(meth)acrylate, a 1,3-propane diol (meth)acrylate, a 1,3-butane diol (meth)acrylate, a pentaerythritol tetra(meth)acrylate, a dipentaerythritol hexa(meth)acrylate, and a dipentaerythritol penta(meth)acrylate, those obtained by adding an $\alpha,\beta$-unsaturated carboxylic acid such as an acrylic acid and a methacrylic acid to a glycyl group containing compound, or a mixture of a 2,2-bis(4-acryloxy diethoxy phenyl)propane, a 2,2-bis(4-methacryloxy pentaethoxy phenyl)propane, a 2,2-bis(4-methacryloxy polyethoxy phenyl)propane [produced by Shin-Nakamura Chemical Co., Ltd., product name: BEP-500]; those obtained by adding an $\alpha,\beta$-unsaturated carboxylic acid such as acrylic acid, (meth)acrylic acid or the like to glycyl group containing compound, which is, for example, a trimethylolpropanetriglycidylethertri(meth)acrylate, a bisphenol A diglycidyletherdi(meth)acrylate, and an acrylic acid adduct of a diglycidyl ether having a fluorene ring [produced by Nippon Steel Chemical Co., Ltd., product name: ASF400]; and unsaturated amides such as a methylene bisacryloamide, and a 1,6-hexamethylene bisacrylamide, vinyl esters such as a divinyl succinate, a divinyl adipate, a divinyl phthalate, a divinyl terephthalate, a divinyl benzene-1,3-disulfonate or the like can be presented.

Moreover, as the photopolymerization initiating agent used in this embodiment, those known can be used alone or by several kinds. For example, a 2-methyl-1-[4-(methylthio) phenyl]-2-morpholino-propane-1-on (commercially available product IRGACURE 907 produced by Chiba Speciality Chemicals), a 2-benzyl 1-2-dimethylamino-1-(4-morpholinophenyl)butanone-1 (commercially available product IRGACURE 369 produced by Chiba Speciality Chemicals), a bis(2,4,6-trimethylbenzoyl)phenylphosphine oxide (product name CGI819 produced by Chiba Speciality Chemicals), a 2,4,6-trimethylbenzoyldiphenylphosphine oxide (Lucirin TPO produced by BASF), a 2,4-trichloromethyl-(piprolonyl)-6-triazine (commercially available product name TRIAZINE produced by Nihon SiberHegner K.K.) or the like can be used.

Moreover, as the thermally polymerization initiating agent used in this embodiment, those known can be used as long as they generate a radial while heating and they are capable of forming a hardened film by polymerizing a resin having the cardo polymer and an unsaturated group of a polyfunctional acrylate monomer. The 10 hour half life temperature is preferably from 80° C. to hardening temperature and more preferably from 100° C. to the hardening temperature.

Moreover, as the epoxy resin having two or more epoxy groups in a molecule, an epoxy compound having less than 1,000 ppm of hydrolysable chlorine component is preferable. For example, a tetramethyldiphenyl type epoxy resin YX4000 produced by Yuka-Shell Epoxy Co. Ltd., a cresol novolak type epoxy resin of EOCN series (EOCN1020, 4400, 102S, 103S, 104S or the like) produced by Nippon Kayaku Co., Ltd., a phenol novolak type epoxy resin, a liquid three functional epoxy resin ZX-1542 produced by Tohto Kaesi Corp., a polyfunctional epoxy compound introducing glycidyl group into a secondary hydroxyl group in an epoxy compound can be presented. The epoxy resins react with a carboxyl group of resin component containing the cardo polymer by heating or the like so as to form a cross-linking structure, in addition to the cross-linking structure formed by the unsaturated group of the resin, containing the cardo polymer, and the polyfunctional acrylate.

Moreover, according to this embodiment, as needed, various kinds of additives such as an anti oxidizing agent, an ultraviolet ray absorbing agent and a plasticizing agent, solvents such as a diethylene glycol dimethyl ether, a cyclohexanone, an ethanol, a chloroform, a tetrahydrofuran, and a dioxane or the like can be used.

Moreover, for coating the material of the planarization layer, a spin coating method, a spray method, a blade coating method, a dip method, a wet coating method using a roller coater machine, a land coater machine or the like can be used.

Moreover, as a material, a hexamethyldisiloxane, a tetramethoxysilane, an octatetramethylsilane, a cyclopentasiloxane, a decamethylcyclopentasiloxane, a 2,2,5,5-tetramethyl-2,5-disila-1-oxacyclopentane, a [2-(3-cyclo hexenyl) ethyl]triethoxysilane, a [2-(3-cyclohexenyl)ethyl] trimethoxysilane, a (cyclohexenyloxy)trimethylsilane, a cyclohexylethyldimethoxysilane, a cyclohexylmethyldimethoxysilane, a cyclohexyltrimethoxysilane, a (3-cyclopentadienylpropyl)triethoxysilane, a cyclopentadienyltrimethylsilane, a cyclopentamethylenedimethylsilane, a (cyclopentenyloxy)trimethylsilane, a cyclopentyltrimethoxysilane, a cyclotetramethyldimethylsilane, a cyclotrimethylenedimethylsilan or the like is used, it can be formed also by a dry coating method such as a deposition method.

In this embodiment, it is preferable that the film thickness of the planarization layer is in the range of 0.005 μm to 20 μm. In particular, when the planarization layer used for the gas barrier substrate of this embodiment is formed by a wet coating method, it is preferably in the range of 0.5 μm to 20 μm, in particular, in the range of 1 μm to 5 μm. Moreover, when it is formed by a dry coating method, it is preferably in the range of 0.005 μm to 5 μm, in particular, in the range of 0.01 μm to 1 μm. Thereby, the adhesive property to the gas barrier layer can be made preferable.

b. Gas Barrier Layer

Next, the gas barrier layer used for the gas barrier substrate of this embodiment will be explained.

The gas barrier layer used for the gas barrier substrate of this embodiment is formed on the planarization layer and it comprises a deposition film having the gas barrier property.

As to the gas barrier layer used in this embodiment, the material thereof is not particularly limited as long as it is formed by the deposition method, and it is preferably one kind or a combination of two or more kinds of a transparent inorganic oxide film, a transparent inorganic oxide nitride film, a transparent inorganic nitride film, and a metal film.

Among the materials, the transparent inorganic oxide film is preferably a silicon oxide film, a silicon nitride oxide film, an aluminum oxide film, a magnesium oxide film, a titanium oxide film, a tin oxide film, or an indium oxide alloy film. Moreover, the transparent inorganic nitride film is preferably a silicon nitride film, an aluminum nitride film, or a titanium nitride film. Moreover, the transparent metal film is preferably an aluminum film, a silver film, a tin film, a chromium film, a nickel film, or a titanium film. Moreover, among the materials, a silicon oxide film or a silicon nitride oxide film are particularly preferable for the good adhesive property to the planarization layer.

Moreover, in this embodiment, for the improvement of the gas barrier property, the deposition film may be laminated by a plurality of layers, and the combination can either be of the same kind or different kinds.

The formation of the gas barrier film in this embodiment is not particularly limited as long as it is executed by the deposition method, and a vacuum deposition method with heating an inorganic oxide, an inorganic nitride, an inorganic oxide nitride, a metal or the like and depositing the same on a base material, an oxidation reaction deposition method of using an inorganic oxide, an inorganic nitride, an inorganic oxide nitride or a metal as the material, introducing oxygen gas for oxidization, and depositing on a base material, a sputtering method of using an inorganic oxide, an inorganic nitride, an inorganic oxide nitride, or a metal as the target material, introducing argon gas, oxygen gas, and sputtering for depositing on the base material, an ion plating method of heating an inorganic oxide, an inorganic nitride, an inorganic oxide nitride, or a metal by a plasma beam generated by a plasma gun for depositing the same on the base material, a plasma enhanced CVD method of using an organic silicon compound as the material when forming a deposition film of a silicon oxide or the like can be presented.

According to this embodiment, as mentioned above, it is preferable that the gas barrier layer is a silicon oxide film or a silicon nitride oxide film. As a thin film of such a silicon oxide, a deposition film formed by a low temperature plasma chemical gas phase growth method using an organic silicon compound as the material can be used. As the organic silicon compound, specifically, a 1,1,3,3-tetramethyldisiloxane, a hexamethyldisiloxane, a vinyltrimethylsilane, a hexamethyldisilane, a methylsilane, a dimethylsilane, a trimethylsilane, a diethylsilane, a propylsilane, a phenylsilane, vinyltriethoxysilane, a tetramethoxysilane, a phenyltriethoxysilane, a methyltriethoxysilane, an octamethylcyclotetrasiloxane or the like can be presented. In this embodiment, among the organic silicon compounds, it is particularly preferable to use a tetramethoxy silane (TMOS), a hexamethyl disiloxane (HMDSO) in terms of the handling property and the deposition film characteristics.

Here, in this embodiment, the film thickness of the gas barrier layer can be selected optionally according to its material, and in general it is preferably in the range of 5 nm to 5,000 nm, and more preferably in the range of 5 nm to 500 nm. Moreover, particularly in the case of the aluminum oxide or silicon oxide film, it is preferably in the range of 10 nm to 300 nm. When it is thinner than the film thickness range, the gas barrier property is deteriorated to the water vapor, the oxygen or the like. Moreover, when it is thicker than the film thickness range, a cracking or the like can be generated when processing the gas barrier substrate of this embodiment so that thereby the gas barrier property can be deteriorated to the water vapor, the oxygen gas or the like.

c. Base Material

Next, the base material used for the gas barrier substrate of this embodiment will be explained. The base material used in this embodiment is not particularly limited as long as the planarization layer can be formed on the base material, and in the present invention it is preferably a transparent base material which is transparent to a visible light. Thereby, the gas barrier substrate of this embodiment can be used for a display substrate or the like. In this embodiment, as such a transparent base material, for example, a glass plate, a film-like material or a sheet-like material made of an organic material or the like can be used.

When a glass plate is used as the transparent base material in this embodiment, it is not particularly limited as long as it has a high transmittance to a visible light. For example, it may be an unprocessed glass plate, or a processed glass plate or the like. As such a glass plate, either an alkaline glass or a non alkaline glass can be used. However, when impurities are problematic in the gas barrier substrate of this embodiment, for example, a non alkaline glass such as the Pyrex (registered trademark) glass can be used preferably. Moreover, the kind of the processed glass plate can be selected optionally according to the application of the gas barrier substrate of this embodiment. For example, one produced by applying a coating process or a step-forming process to a transparent glass substrate or the like can be presented.

The film thickness of the glass plate is preferably in the range of 30 µm to 2 mm. Particularly in the case of use as a flexible substrate, it is preferably in the range of 30 µm to 60 µm. In the case of use as a rigid substrate, it is preferably in the range of 60 µm to 2 mm.

Moreover, as the organic material used as a transparent base material in this embodiment, a polyallylate resin, a polycarbonate resin, a crystallized polyethylene terephthalate resin, a polyethyleneterephthalate resin, a polyethylenenaphthalate resin, a UV hardening type methacrylic resin, a polyether sulfone resin, a polyetheretherketone resin, a polyetherimide resin, a polyphenylenesulfide resin, a polyimide resin or the like can be presented.

Here, in this embodiment, when the gas barrier substrate is used for, for example, an organic EL device, it preferably has the heat resistance. As an organic material having the heat resistance, for example, a polarized polymer having a cycloalkyl skeleton can be presented. Specifically, an acrylate compound having a cycloalkyl skeleton, or a methacrylate compound, and a derivative thereof or the like can be presented. In particular, a resin composition including a (meth)acrylate compound (in this embodiment it denotes an acrylate compound or a methacrylate compound) having a cycloalkyl skeleton and a resin composition and a derivative thereof as disclosed in JP-A No. 11-222508 can be presented.

Moreover, as to an organic material having the heat resistance, it is preferable that the coefficient of thermal expansion in the range from a room temperature to 150° C. is 80 ppm or less and the overall optical transmittance is 85% or more. When the coefficient of thermal expansion is more than the value, the substrate size is not stable at a high temperature so that a problem of deterioration of the barrier performance due to the thermal expansion and contraction or a problem of intolerance of the heat process can easily occur.

Here, the coefficient of thermal expansion in this embodiment denotes the size fluctuation amount of a sample having a 5 mm width and a 20 mm length measured with a 5° C./minute temperature rise ratio in a 25 to 200° C. temperature range while applying a certain load (2 g) in the longitudinal direction. Moreover, the overall optical transmittance denotes the value measured by Suga Test Instruments Co., Ltd., (COLOUR S&M COMPUTER MODEL SM-C: model number).

It is preferable that the transparent base material of this embodiment has the heat resistance of 130° C. or more, preferably 200° C. or more, further preferably 250° C. or more.

Moreover, the base material of this embodiment can be used in a combination of two or more kinds with the organic material, and for example, a cyclicpolyolefin based resin, a polystyrene based resin, an acrylonitrile-styrene copolymer (AS resin), an acrylonitrile-butadiene-styrene copolymer (ABS resin), a poly(meth) acrylic based resin, a polycarbonate based resin, a polyethylene terephthalate, a polyester based resin such as a polyethylenenaphthalate, a polyamide based resin such as various kinds of nylons, a polyurethane based resin, a fluorine based resin, an acetal based resin, a cellulose based resin, a polyether sulfone based resin or the like.

According to this embodiment, when forming the base material by laminating a plurality of layers, for example, various films or sheets produced by forming resin films or sheets of each layer by a method of forming a film of one or more kinds of the resins by an extrusion method, a cast molding method, a T die method, a cutting method, an inflation method, or another film forming method, a method of forming a film by the multiple layer co-extrusion using two or more kinds of various kinds of resins, a method of forming a film by using two or more kinds of resins, and mixing before the film formation or the like, and furthermore, in the case drawing is needed, by drawing one axially or two axially by for example the tenter method, the tublar method or the like can be used. Moreover, the films or the sheets of the various kinds of the resins can be used by attaching.

Moreover, various plastic composition agents or additives can be added to improve the film processing ability, the heat resistance, the weather resistance, the mechanical property, the size stability, the anti oxidizing property, the slipping property, the mold releasing property, the flame retarding property, the antimycotic property, the electric characteristic, the strength or the like when forming a film of one or more kinds of the various kinds of the resins. As to the addition amount, it can be added optionally from a minute amount to several 10% according to the purpose. As a general additives, a lubricating agent, a cross-linking agent, an anti oxidizing agent, an ultraviolet ray absorbing agent, a photostabilizing agent, a filling agent, a reinforcing agent, a charge preventing agent, a pigment or the like can be used. Moreover, an improving resins or the like can be used as well.

In this embodiment, when providing the base material by using the organic materials, it is preferably in the range of 10 µm to 500 µm, more preferably 50 to 400 µm, further preferably 100 to 300 µm. When it is thicker than the range, the shock resistance is poor when processing the gas barrier substrate of this embodiment, the winding operation is difficult when winding so that the gas barrier property to the water vapor, the oxygen or the like is deteriorated or the like. Moreover, when it is thinner than the range, the mechanical suitability is poor so that the gas barrier property to the water vapor, the oxygen or the like is lowered.

Moreover, according to this embodiment, in the case of using the materials not having the heat resistance, a glass plate or the like as the base material, it is preferable to form a transparent resin layer having the heat resistance on the base material. A preferable transparent resin layer with the heat resistance has 80 ppm or less of coefficient of thermal expansion in the range from a room temperature to 150° C., and 85% or more of overall optical transmittance. Thereby, the heat resistance can be provided to the base material.

It is preferable that the transparent resin layer is a polarized polymer having a cycloalkyl skeleton as the organic material having the heat resistance. As such a material, specifically, it is preferably a (meth)acrylate compound having the polarity or a derivative thereof. For example, a methyl(meth)acryalte homopolymer, or a copolymer obtained by polymerizing a mixture of a methyl(meth)acrylate and other copolymerizable monomer having a vinyl group can be presented (in this embodiment, (meth)acrylic denotes acrylic or methacrylic).

As the monomer copolymerizable with the methyl(meth) acrylate, ester acrylates such as a methyl acrylate, an ethyl acrylate, a propyl acrylate, an isopropyl acrylate, a butyl acrylate, a cyclohexyl acrylate, a phenyl acrylate, a benzyl acrylate, and a 2,2,2-trifluoroethyl acrylate, ester methacrylates such as an ethyl methacrylate, a cyclohexyl methacrylate, a phenyl methacrylate, and a 2,2,2-trifluoroethyl methacrylate, vinyl compounds such as an acrylonitrile and a styrene, acid anhydrides such as a maleic anhydride and an itaconic anhydride, maleimide compounds such as a cyclohexyl maleimide and a phenyl maleimide or the like can be presented.

In this embodiment, the transparent resin layer can be formed by mixing the resin with an additive, as needed, such as a polymerization initiating agent or a polyfunctional acrylate monomer, and then coating the same on the transparent base material or glass substrate, and hardening by the ultraviolet ray irradiation.

The film thickness of the transparent resin layer is preferably 5 nm to 100 µm, and it is preferable that the film thickness of the transparent resin layer is in the range of 0.00001 to 1 with the premise that the film thickness of the base material is 1.

d. Gas Barrier Substrate

Next, the gas barrier substrate of this embodiment will be explained. The gas barrier substrate of this embodiment is not particularly limited as long as it has the base material, the planarization layer formed on the base material, and the gas barrier layer formed on the planarization layer.

In this embodiment, it is preferable that the oxygen transmission rate in the gas barrier substrate is 0.3 cc/m$^2$/day·atm or less, in particular, 0.1 cc/m$^2$/day·atm or less, and the water vapor transmission rate is 0.1 g/m$^2$/day or less, in particular, 0.05 g/m$^2$/day or less. Since the oxygen transmission rate and the water vapor transmission rate of the gas barrier substrate of the present invention is in the range, those having a high gas barrier property can be provided so that they can be used for supporting substrate having a member vulnerable to the oxygen, the water vapor, or the like, such as an organic EL device.

Here, the oxygen transmission rate is the value measured by an oxygen gas transmission rate measuring device (produced by MOCON, OX-TRAN 2/20: product name) under the conditions of the measurement temperature 23° C., and the humidity 90% Rh, and the water vapor transmission rate is the value measured by a water vapor transmission rate measuring device (produced by MOCON, PERMATRAN-W 3/31: product name) under the conditions of the measurement temperature 37.8° C., and the humidity 100% Rh.

Moreover, according to the present invention, it is preferable that the average surface roughness of the gas barrier substrate is 6 nm or less, in particular, 3 nm or less, and the maximum height difference of surface (peak to valley) is 60 nm or less, in particular, 30 nm or less. Thereby, formation of the ruggedness, the pin hole or the like in a layer to be formed on the gas barrier substrate of the present invention can be prevented so that it can be used for various applications such as the display substrate for an organic EL device.

Moreover, according to this embodiment, the planarization layer and the gas barrier layer may be laminated further on the gas barrier layer in this order by a plurality of layers. In this embodiment, it is preferable that the planarization layer and the gas barrier layer are laminated in this order on the transparent base material in the range of 2 to 4 layers. In particular, one having two layers, that is, the gas barrier layer laminated on the planarization layer is most preferable. When the flatness is particularly required on the surface of the gas barrier substrate of this embodiment, it is preferable that the planarization layer is formed on the uppermost surface.

Moreover, according to the gas barrier substrate of this embodiment, it is preferable that a stress releasing layer is formed on the surface of the base material, where the opposite side to the planarization layer. Thereby, the stress generated when forming the planarization layer or the gas barrier layer on the base material can be reduced so that warpage in the gas barrier substrate can be restrained.

Such a stress releasing layer is not particularly limited as long as it is a layer capable of releasing the stress, and in this embodiment, it is preferable to form the same layer as the gas barrier layer. Thereby, since the gas barrier property can be provided on the opposite surface of the gas barrier substrate, a gas barrier substrate having a higher gas barrier property can be provided. Moreover, the stress releasing layer is not limited to one layer, and for example, one having the gas barrier layer and the planarization layer laminated or the like can be used as well.

2. Second Embodiment

Next, the second embodiment of the gas barrier substrate of the present invention will be explained. The second embodiment of the gas barrier substrate of the present invention comprises a base material, a gas barrier layer comprising a deposition film formed on the base material, and a planarization layer, formed on the gas barrier layer, having a cardo polymer.

Figure 2:
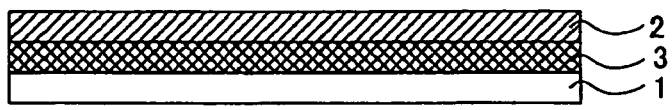
FIG. 2 is a schematic cross sectional view showing another example of a gas barrier substrate of the present invention.

The gas barrier substrate of this embodiment comprises a base material 1, a gas barrier layer 3 formed on the base material 1, and a planarization layer 2 formed on the gas barrier layer 3 as shown in FIG. 2.

According to this embodiment, since the cardo polymer used for the planarization layer has a high adhesive property to the gas barrier layer so that it can fill a pin hole of the gas barrier layer or the like, thereby a gas barrier substrate having a high gas barrier property can be provided. Moreover, since the planarization layer is formed on the gas barrier substrate surface, it has a flat surface. Thereby, for example, when forming an organic EL layer of an organic EL device, an even layer can be provided so that a gas barrier substrate to be used for the various applications can be provided.

Hereinafter, each configuration of the gas barrier substrate of this embodiment will be explained. Since the gas barrier layer, the base material or the like used in this embodiment are same as those explained in the first embodiment, explanation is omitted here.

a. Planarization Layer

Firstly, a planarization layer used in this embodiment will be explained. The planarization layer used in this embodiment is a layer to be formed on the gas barrier layer, and having a cardo polymer. The cardo polymer used in this embodiment in general has a good adhesive property to the material used for the gas barrier layer. Thereby, when the planarization layer is formed on the gas barrier layer, it can be adhered with the gas barrier layer, and it can fill a minute pin hole of the gas barrier layer or the like so that a gas barrier substrate having a high gas barrier property can be provided.

Here, since the planarization layer having a cardo polymer used in this embodiment is same as those explained for the planarization layer of the first embodiment, detailed explanation is omitted here.

b. Gas Barrier Substrate

Next, the gas barrier substrate of this embodiment will be explained.

The gas barrier substrate of this embodiment is not particularly limited as long as it comprises the base material, the gas barrier layer formed on the base material, and the planarization layer formed on the gas barrier layer. In this embodiment, it is preferable that the gas barrier layer is laminated further on the planarization layer. Thereby, the gas barrier property of the gas barrier substrate of this embodiment can be made higher. Moreover, as needed, the gas barrier layer or the planarization layer can further be laminated. Particularly when the flatness is required for the surface of the gas barrier substrate, it is preferable that the planarization layer is formed on the uppermost surface of the gas barrier substrate.

Moreover, according to the gas barrier substrate of this embodiment, as in the first embodiment, the stress releasing layer or the like may be formed.

Here, since the water vapor transmission rate, the oxygen transmission rate, the surface roughness, the maximum height difference of surface (peak to valley) or the like of this embodiment are same as those explained in the first embodiment, explanation is omitted here.

B. Organic EL Device Substrate

Next, the organic EL device substrate of the present invention will be explained.

The organic EL device substrate of the present invention includes two embodiments. Firstly, as the third embodiment, an organic EL device substrate comprises a base material, a color conversion layer formed on the base material, a planarization layer formed on the color conversion layer, and a gas barrier layer comprising a deposition film formed on the planarization layer. As the fourth embodiment, an organic EL device substrate comprises a base material, a color conversion layer formed on the base material, an overcoat layer formed on the color conversion layer, a gas barrier layer comprising a deposition film formed on the overcoat layer, and a planarization layer, formed on the gas barrier layer, having a cardo polymer.

According to the present invention, since the planarization coat layer or planarization layer having the flatness is formed in both embodiments, the flatness of the surface of the organic EL device substrate can be made higher. Thereby the organic EL layer can be formed flatly when forming an organic EL layer using the organic EL device so that one having a high quality without formation of a dark spot or the like can be provided.

Moreover, according to the present invention, since the gas barrier layer is laminated on the planarization layer, the gas barrier layer can be a dense layer having a high gas barrier property. Thereby, when forming an organic EL layer on the organic EL device substrate of the present invention, an organic EL device substrate capable of preventing invasion of the oxygen, the water vapor or the like generated from the color conversion layer into the organic EL layer side can be provided.

Hereinafter, each embodiment of the organic EL device substrate of the present invention will be explained.

1. Third Embodiment

Firstly, the third embodiment of the organic EL device substrate of the present invention will be explained. The third embodiment of the organic EL device substrate of the present invention comprises a base material, a color conversion layer formed on the base material, a planarization layer formed on the color conversion layer, and a gas barrier layer comprising a deposition film formed on the planarization layer. That is, the color conversion layer is formed between the base material and the planarization layer of the gas barrier substrate mentioned in the first embodiment of the "A. Gas barrier substrate".

Figure 3:
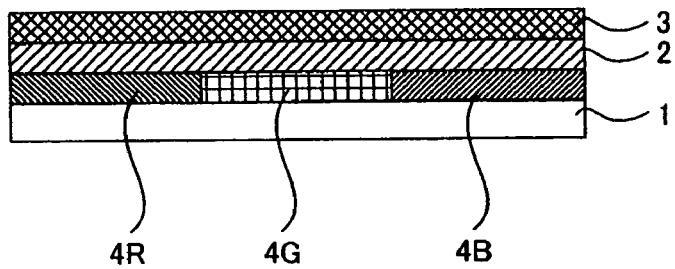
FIG. 3 is a schematic cross sectional view of showing an example of an organic EL device substrate of the present invention.

The organic EL device substrate of this embodiment comprises the base material 1, the color conversion layer 4 (4R, 4G and 4B) formed on the base material 1, and the planarization layer 2 formed on the color conversion layer, and the gas barrier layer 3 formed on the planarization layer 2 as shown in FIG. 3.

According to this embodiment, since the gas barrier layer is formed on the planarization layer having the flatness, the gas barrier layer can be a dense layer having a high gas barrier property. Moreover, since the planarization layer is formed between the gas barrier layer and the base material or the color conversion layer, the adhesive property of the gas barrier layer and the base material or the like can be made higher. Thereby, one having a high gas barrier property can be provided. Accordingly, when the organic EL device substrate of this embodiment is used for the organic EL device, one having a high quality can be provided without suffering the influence of the oxygen or the water vapor generated from the color conversion layer due to the time passage or from the outside of the organic EL device.

Moreover, according to this embodiment, since the planarization layer is formed, the surface of the organic EL layer substrate can be made flat so that the organic EL layer can be formed evenly when providing an organic EL device. Thereby, an organic EL device without a dark spot or the like can be provided.

Hereinafter, each configuration of the organic EL device substrate of this embodiment will be explained.

a. Planarization Layer

Firstly, the planarization layer used for the organic EL device substrate of this embodiment will be explained. The planarization layer used in this embodiment is formed on the color conversion layer. The planarization layer has a flat surface, flattens the grade difference of the color conversion layer, and protects the color conversion layer from flawing generated when forming the gas barrier layer or the like.

Since the color conversion layer has a relatively high film thickness, it is difficult to form a flat layer when the gas barrier layer or the like is formed on the color conversion layer. Furthermore, there is a problem that the color conversion layer is corroded when forming the gas barrier layer or the like. In this embodiment, by forming the planarization layer on the color conversion layer, the color conversion layer can be protected and the ruggedness of the color conversion layer can be flattened to obtain further flattened surface. Thereby, the gas barrier layer can be formed densely and flatly so that an organic EL device substrate having a high gas barrier property can be provided.

Moreover, it is preferable that the planarization layer used in this embodiment has a high transmittance to the visible light. Specifically, the transmittance to the visible light (in the range of 400 nm to 700 nm) is preferably 50% or more, in particular, 85% or more. Thereby, one having a high luminosity can be provided when providing an organic EL device.

Here, the transmittance to the visible light is the value measured by a spectrophotometer (type number: UV-3100PC produced by Shimadzu Corporation).

It is preferable that the film thickness of the planarization layer in this embodiment is in the range of 0.005 µm to 20 µm as mentioned for the planarization layer of the "A. Gas barrier substrate 1. First embodiment", and it is more preferably in the range of 5 µm to 10 µm. Thereby, the surface of the color conversion layer can be flattened, and moreover, corrosion of the color conversion layer when forming the gas barrier layer or the like can be prevented.

Since the material of the planarization layer, the forming method or the like are same as those mentioned for the planarization layer of the "A. Gas barrier substrate 1. First embodiment", explanation is omitted here.

b. Gas Barrier Layer

Next, the gas barrier layer used in this embodiment will be explained. The gas barrier layer used in this embodiment is a layer having the gas barrier property, to be formed on the planarization layer by the deposition method. In this embodiment, since the gas barrier layer is formed on the planarization layer, the gas barrier property can be provided to the organic EL device substrate of this embodiment, and a layer having the excellent flatness and gas barrier property can be provided.

As such a gas barrier layer, one having the electric insulation property and the resistance to an organic solvent is preferable. Furthermore, it preferably has the transmittance to the visible light of 50% or more, in particular, 85% or more. Thereby, one having a high luminosity can be provided when forming an organic EL device. Here, the transmittance to the light is measured by the method mentioned above.

Moreover, according to this embodiment, since the transparent electrode layer is formed on the gas barrier layer when providing, for example, an organic EL display substrate, it preferably has enough hardness to be applied when forming the transparent electrode layer. Specifically, it preferably has the hardness of 2H or more in the pencil hardness test of JIS K5400.

Since the material of the gas barrier layer, the forming method, the film thickness or the like are same as those mentioned for the gas barrier layer of the "A. Gas barrier substrate 1. First embodiment", explanation is omitted here.

c. Color Conversion Layer

Next, the color conversion layer used in this embodiment will be explained. The color conversion layer used in this embodiment to be formed on the base material is a layer containing a fluorescent material for absorbing the light emitted from the organic EL layer and emitting a visible light range fluorescent light. The color conversion layer used in this embodiment is not particularly limited as long as it can provide blue, red and green colors by using a light from the organic EL light emitting layer. For example, the color conversion layers each emitting blue, red, or green light of three colors of fluorescent layers may be formed. For example, when using a blue organic EL light emitting layer for the organic EL device, a transparent layer may be formed instead of the blue conversion layer.

Such a color conversion layer in general contains an organic fluorescent pigment for absorbing the light from the organic EL light emitting layer and emitting a fluorescent light, and a matrix resin.

The organic fluorescent pigment contained in the color conversion layer absorbs a light in a near ultraviolet range or a visible range emitted from a light emitting member, in particular, a light in a blue or blue green range, and emits a visible light of a different wavelength as the fluorescent light. Since the blue light emitting layer is used in general as the light emitting layer for the organic EL layer, in this embodiment, it is preferable to use one or more kinds of fluorescent pigments which emit at least a fluorescent light in a red range, and it is preferable to use in a combination with one or more kinds of fluorescent pigments which emit a fluorescent light in a green range.

That is, when using an organic EL light emitting layer emitting a light in a blue or blue green range as the light source, if a light in a red range is to be obtained by passing the light from the organic EL light emitting layer through a mere red filter layer, an extremely dark output light is provided because the light having a red range wavelength is little originally. Therefore, by converting the light in the blue or blue green range from the organic EL light emitting layer into a light in a red range by the fluorescent pigment, a light in a red range having a sufficient strength can be output.

In contrast, same as in the case of a light in a red range, a light in a green range can be output by converting the light from the organic EL light emitting layer into a light in a green range by another organic fluorescent pigment. Alternatively when the light emission of the organic EL light emitting layer includes a light in a green range sufficiently, the light from the organic EL light emitting layer may be output simply through the green color filter layer. Furthermore, as to a light in a blue range, although it can be output by converting the light from the organic EL light emitting layer using a fluorescent pigment, it is preferable to output the light of the organic EL light emitting layer simply through the blue color filter layer.

As the fluorescent pigment for absorbing a light in a blue to blue green range emitted from the organic EL light emitting layer and emitting a fluorescent light in a red range, for example, rhodamine based pigments such as rhodamine B, rhodamine 6G, rhodamine 3B, rhodamine 101, rhodamine 110, sulfo rhodamine, basic violet 11, and basic red 2, cyanine based pigments, pyridine based pigments such as a 1-ethyl-2-[4-(p-dimethylaminophenyl)-1,3-butadienyl]-pyridi nium perchlorate (pyridine 1), oxadine based pigments or the like can be presented. Furthermore, various kinds of dyes (direct dyes, acidic dyes, basic dyes, dispersion dyes or the like) can be used as well as long as they have the fluorescent property.

Moreover, as the fluorescent pigment for absorbing a light in a blue or blue green range emitted from the organic EL light emitting layer and emitting a fluorescent light in a green range, for example, coumarin based pigments such as a 3-(2'-benzothiazolyl)-7-diethyl amino coumarin (coumarin 6), a 3-(2'-benzoimidazoyl)-7-N,N-diethylamino coumarin (coumarin 7), a 3-(2'-N-methylbenzoimidazolyl)-7-N,N-diethylamino coumarin (coumarin 30), and a 2,3,5,6-1H,4H-tetrahydro-8-trifluoromethylquinolidine(9,9a, 1-gh) coumarin (coumarin 153), coumarin pigment based dyes such as basic yellow 51, naphthalimide based pigments such as solvent yellow 11, and solvent yellow 116 or the like can be presented. Furthermore, various kinds of dyes (direct dyes, acidic dyes, basic dyes, dispersion dyes or the like) can be used as well as long as they have the fluorescent property.

The organic fluorescent pigments used in this embodiment can be kneaded preliminarily into an ester polymethacrylate, a polyvinylchloride, a vinylchloride-vinylacetate copolymer resin, an alkyd resin, an aromatic sulfone amide resin, a urea resin, a melamine resin, a benzoguanamine resin, a resin mixture thereof or the like so as to be a pigment for providing the organic fluorescent pigment. Moreover, the organic fluorescent pigments and the organic fluorescent coloring matters (in this embodiment, the two items are both referred to as the organic fluorescent pigments) can be used alone, or in a combination of two or more kinds for adjusting the color hue of the fluorescent light.

The organic fluorescent pigment used in this embodiment is contained in the color conversion layer by 0.01 to 5% by weight based on the weight of the color conversion layer, more preferably by 0.1 to 2% by weight. When the content of the organic fluorescent pigment is less than 0.01% by weight, the wavelength conversion cannot be executed sufficiently. Moreover, when the content is more than 5%, the color conversion efficiency is lowered due to the effect of the density extinction or the like.

Moreover, as the matrix resin used in this embodiment, those produced by polymerizing or cross-linking a photosetting or photothermal combination type hardening type resin (resist) by a photo and/or heat treatment for generating the radical species or ion species, and then make them insoluble and infusible can be used. For patterning the color conversion layer, it is preferable that the photosetting or photothermal combination type hardening type resin is preferably soluble with an organic solvent or an alkaline solution in an unexposed state.

The photosetting or photothermal combination type hardening resin includes (1) a composition made of an acrylic based polyfunctional monomer having a plurality of acroyl groups or methacroyl groups and an oligomer, and a photo or thermal polymerization initiating agent, (2) a composition made of a polyvinyl ester cinnamate and a sensitizing agent, (3) a composition made of a chain like or cyclic olefin and a bisazide, (4) a composition made of a monomer having an epoxy group and an acid generating agent or the like. In particular, (1) the composition made of an acrylic based polyfunctional monomer and an oligomer, and a photo or thermal polymerization initiating agent is preferable for the capability of highly precise patterning and the high reliability of the solvent resistance, the heat resistance or the like. As mentioned above, the matrix resin is formed by conducting the light and/or the heat to the photosetting or photothermal combination type hardening type resin.

Moreover, it is preferable that the photopolymerization initiating agent, the sensitizing agent and the acid generating agent to be used in this embodiment start the polymerization by a light of a wavelength not to be absorbed by the contained fluorescent conversion pigment. When the resin itself in the photosetting type or photothermal combination type hardening type resin can be polymerized by the light or the heat, the photopolymerization initiating agent and the thermal polymerization initiating agent may not be added.

The color conversion layer used in this embodiment can be formed by forming a resin layer by coating on the supporting substrate a solution or a dispersion containing a photosetting type or photothermal combination type hardening resin as the materials for the matrix resin and an organic fluorescent pigment, polymerizing by exposing the photosetting type or photothermal combination type hardening type resin in a desired portion, and then patterning. The above-mentioned patterning operation can be executed by a common method by using an organic solvent or an alkaline solution for eliminating the resin in the unexposed part or the like.

The film thickness of the color conversion layer used in this embodiment is preferably 5 μm or more, and in particular in the range of 8 μm to 15 μm. Moreover, the shape of the color conversion layer can be selected optionally according to the purposed organic EL device. For example, rectangular or round areas of red, blue and green colors as a set can be formed each on a transparent base material, or they can be formed like stripes. Moreover, a specific color conversion layer may be formed by the amount more than the other color conversion layers.

d. Base Material

Next, the base material used in this embodiment will be explained. The base material used in this embodiment has the color conversion layer formed thereon, and it is not particularly limited as long as it can be transmitted a light emitted form the light emitting layer of the organic EL device and transmitted through the color conversion layer. In this embodiment, those having the solvent resistance, the heat resistance, and the excellent size stability are preferable. Thereby, the formation of the color conversion layer can be executed stably.

Since the material of the base material, the film thickness, the forming method, and the other points are same as those mentioned for the base material of the "A. Gas barrier substrate 1. First embodiment", explanation is omitted here.

e. Organic EL Device Substrate

Next, the organic EL device substrate of this embodiment will be explained. The organic EL device substrate of this embodiment is not particularly limited as long as it comprises the color conversion layer formed on the base material, the planarization layer formed on the color conversion layer, and the gas barrier layer formed on the planarization layer.

In this embodiment, it is preferable that the oxygen transmission rate in the organic EL device substrate is 0.3 cc/m$^2$/day·atm or less, in particular, 0.1 cc/m$^2$/day·atm or less, and the water vapor transmission rate is 0.1 g/m$^2$/day or less, in particular, 0.05 g/m$^2$/day or less. Since the oxygen transmission rate and the water vapor transmission rate of the organic EL device substrate of the present invention is in the range, those having a high gas barrier property can be provided so that an organic EL device substrate capable of forming a high quality organic EL device can be provided. Here, the oxygen transmission rate and water vapor transmission rate are the values measured by the methods mentioned above.

Moreover, in this embodiment, it is preferable that the transmittance of the organic EL device substrate to the visible light is 50% or more, in particular, 85% or more. Thereby, when providing an organic EL device with the organic EL device substrate of this embodiment, one having a high luminosity can be provided. Here, the transmittance is the value measured by the method mentioned above.

Moreover, in this embodiment, it is preferable that the surface average coarseness of the organic EL device substrate is 6 nm or less, in particular, 3 nm or less, and the maximum height difference of surface (peak to valley) is 60 nm or less, in particular, 30 nm or less. Thereby, formation of the ruggedness, the pin hole or the like in a layer to be formed on the organic EL device substrate can be prevented so that generation of a dark spot or the like in the organic EL device can be prevented.

Figure 4:
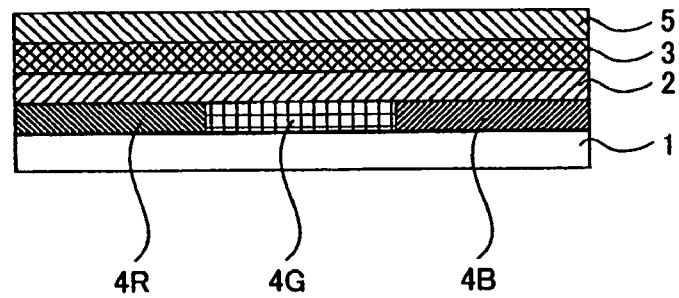
FIG. 4 is a schematic cross sectional view of showing another example of an organic EL device substrate of the present invention.

According to this embodiment, for example as shown in FIG. 4, it is preferable that the color conversion layer 4 (4R, 4G, 4B) is formed on the base material 1, the planarization layer 2 is formed on the color conversion layer 4, the gas barrier layer 3 is formed on the planarization layer 2, and the planarization coat layer 5 formed further on the gas barrier layer 3. Thereby, the surface of the organic EL device substrate of this embodiment can be made flat. Moreover, in this embodiment, the planarization coat layer and the gas barrier layer may be laminated in the range of 2 to 4 layers in this order on the gas barrier layer.

Furthermore, according to this embodiment, as needed, a color filter layer may be formed between the base material and the color conversion layer. Thereby, when providing an organic EL device with the organic EL device substrate of this embodiment, an organic EL device having a high color reproductivity can be provided.

Moreover, according to the organic EL device substrate of this embodiment, it is preferable that that a stress releasing layer is formed on the opposite surface where color conversion layer is formed. Thereby, the stress generated when forming the color conversion layer or the gas barrier layer on the transparent base material can be reduced so that warpage in the organic EL device substrate can be restrained.

Since the stress releasing layer is same as that mentioned for the gas barrier substrate of the "A. Gas barrier substrate 1. First embodiment", explanation is omitted here.

Hereinafter, the planarization coat layer and the color filter used for the organic EL device substrate of this embodiment will be explained.

(Planarization Coat Layer)

Firstly, the planarization coat layer to be used for the organic EL device substrate of this embodiment will be explained. In the organic EL device substrate of this embodiment, since the planarization coat layer is formed on the gas barrier layer, the flatness of the surface of the organic EL device substrate can be improved so that generation and growth of a dark spot or the like can be prevented when providing an organic EL device.

It is preferable that the film thickness of the planarization coat layer used in this embodiment is in the range of 0.05 µm to 10 µm. Moreover, as to the flatness, the average surface roughness (Ra) is preferably 6 nm or less, and more preferably 20 nm or less. Moreover, it is preferable that the maximum height difference of surface (peak to valley) is 60 nm or less, more preferably 20 nm or less. Thereby, even when forming a light emitting layer or the like of the organic EL device on the organic EL device substrate of this embodiment, a high quality organic EL device can be formed without a dark spot or the like without forming the ruggedness or the pin hole.

Moreover, when the organic EL device substrate of this embodiment is used as the organic EL display substrate, since the transparent electrode layer is formed on the planarization coat layer, it preferably has the stable hardness to the force applied when forming the transparent electrode layer, and specifically, it preferably has the hardness of 2H or more in the pencil hardness test of JIS K5400.

Since the material, the forming method or the like of the planarization coat layer are same as those mentioned for the planarization layer of the "A. Gas barrier substrate 1. First embodiment", explanation is omitted here.

(Color Filter Layer)

Next, the color filter layer used in this embodiment will be explained. The color filter layer used in this embodiment is a layer for adjusting the color tone of the light transmitted through the color conversion layer. The color filter layers of blue, red, and green colors are each formed at a position corresponding to each color of the color conversion layer. Since the color filter layer is formed, in the case of the use of the organic EL device substrate of this embodiment for the organic EL device, highly pure color development can be achieved so that one having a high color reproductivity can be provided.

The color filter layer used in this embodiment can be formed by a photolithography method or the like with a pigment or a resin to be used in general for a color filter. Moreover, a black matrix may be formed between the colors.

2. Fourth Embodiment

Next, the fourth embodiment of the organic EL device substrate of the present invention will be explained. The fourth embodiment of the organic EL device substrate of the present invention comprises a base material, a color conversion layer formed on the base material, an overcoat layer formed on the color conversion layer, a gas barrier layer comprising a deposition film formed on the overcoat layer, and a planarization layer, having a cardo polymer, formed on the gas barrier layer. That is, the color conversion layer and the overcoat layer are formed in this order and between the base material and the gas barrier layer of the gas barrier substrate mentioned in the second embodiment of the "A. Gas barrier substrate".

Figure 5:
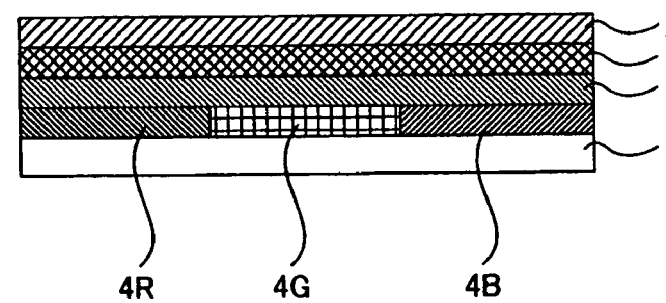
FIG. 5 is a schematic cross sectional view of showing another example of an organic EL device substrate of the present invention.

The organic EL device substrate of this embodiment comprises the base material 1, the color conversion layer 4 (4R, 4G and 4B) formed on the base material 1, the overcoat layer 6 formed on the color conversion layer 4, the gas barrier layer 3 formed on the overcoat layer 6, and the planarization layer 2 formed on the gas barrier layer 3 as shown in FIG. 5.

According to this embodiment, since the planarization layer is formed on the gas barrier layer, the adhesive property between the gas barrier layer and the planarization layer is high and furthermore, since the pin hole of the gas barrier layer can be filled by the planarization layer or the like so that an organic EL device substrate having a high gas barrier property can be provided. Moreover, since the planarization layer is formed on the surface of the organic EL device substrate, one having the flat surface can be provided so that one having a high quality without a pin hole or the like can be provided when forming an organic EL layer or the like on the organic EL device substrate.

Hereinafter, each configuration of the organic EL device substrate of this embodiment will be explained. Since the base material, the color conversion layer and the gas barrier layer are same as those explained in the third embodiment or in "A. Gas barrier substrate 1. First embodiment", explanation is omitted here.

a. Planarization Layer

Firstly, the planarization layer used in this embodiment will be explained. The planarization layer used in this embodiment is a layer to be formed on the gas barrier layer having a cardo polymer, with the flat surface. The cardo polymer used in this embodiment in general has a good adhesive property with the material used for the gas barrier layer. Thereby, since the planarization layer can adhere with the gas barrier layer and the minute pin hole or the like of the gas barrier layer can be filled when it is formed on the gas barrier layer so that an organic EL device substrate having a high gas barrier property can be formed.

Moreover, when the organic EL device substrate of this embodiment is used as the organic EL display substrate, since the transparent electrode layer is formed on the planarization layer, it preferably has the stable hardness to the force applied when forming the transparent electrode layer, and specifically, it preferably has the hardness of 2H or more in the pencil hardness test of JIS K5400.

Since the transmittance to the visible light of the planarization layer, the film thickness or the like are same as those explained in the third embodiment, and furthermore, the material, the forming method or the like of the planarization layer are same as those mentioned for the planarization layer of the "A. Gas barrier substrate 1. First embodiment", explanation is omitted here.

b. Overcoat Layer

Next, the overcoat layer used in this embodiment will be explained. The overcoat layer used in this embodiment is a layer formed on the color conversion layer for planarization of the grade difference of the color conversion layer, or preventing corrosion or the like of the color conversion layer when forming the gas barrier layer.

The overcoat layer used in this embodiment is preferably made of a material which is transparent to the visible light. Specifically, the transmittance to the visible light is preferably 50% or more, further preferably 85% or more. Thereby, when forming an organic EL device, one having a high luminosity can be provided. Here, the transmittance to the visible light is measured by the method mentioned above.

As the overcoat layer used in this embodiment, specifically, a photosetting type resist material having a reactive vinyl group such as an acrylic acid based one, a methacrylic acid based one, a polyvinyl cinnamate based one, and cyclic rubber based one can be used. These materials can be used by coating on the substrate by, for example, a spin coating method, a roll coating method, a bar coating method, a cast method or the like, exposing the coating film via a predetermined photo mask, and then eliminating the unnecessary part using a developing agent so as to form a pattern. The film thickness can be set such that the ruggedness of the color conversion layer can be flattened, and it is in general 5 μm to 10 μm.

Moreover, the overcoat layer can be formed also by printing or coating a low melting point glass paste made of a low melting point glass frit, a binder resin and a solvent.

c. Organic EL Device Substrate

Next, the organic EL device substrate of this embodiment will be explained. The organic EL device substrate of this embodiment is not particularly limited as long as it has a base material, a color conversion layer formed on the base material, an overcoat layer formed on the color conversion layer, a gas barrier layer comprising a deposition film formed on the overcoat layer, and a planarization layer, having a cardo polymer, formed on the gas barrier layer. Also in this embodiment, the planarization layer and the gas barrier layer may be formed in this order on the gas barrier layer, moreover, a stress releasing layer or a color filter layer may be formed as well.

Since the stress releasing layer used in this embodiment is same as that mentioned in the gas barrier substrate of the "A. Gas barrier substrate 1. First embodiment", and the color filter layer is same as that explained in the third embodiment, explanation is omitted here.

3. Others

Moreover, the organic EL substrate of the present invention may be an embodiment comprising a base material, a color conversion layer formed on the base material, an overcoat layer formed on the color conversion layer, a planarization layer formed on the overcoat layer, and a gas barrier layer comprising a deposition film, formed on the planarization layer. According to this embodiment, since the gas barrier layer is formed on the planarization layer, the gas barrier layer can be formed densely, and moreover, the adhesive property between the gas barrier layer and the transparent base material or the like can be improved, an organic EL device substrate having a high gas barrier property can be provided.

Moreover, as needed, a planarization layer or a gas barrier layer may be laminated, and moreover, a stress releasing layer, a color filter layer or the like may be formed.

Since the base material, the color conversion layer, the planarization layer, the gas barrier layer, the color filter layer or the like used in this embodiment are same as those explained in the third embodiment, and moreover, the overcoat layer is same as that explained in the fourth embodiment or in the "A. Gas barrier substrate 1. First embodiment", explanation is omitted here.

C. Display Substrate

Next, the display substrate of the present invention will be explained. The display substrate of the present invention comprises a transparent electrode layer formed on the gas barrier substrate.

According to the present invention, since the gas barrier substrate is used, a display substrate having a high gas barrier property and a high flatness can be provided so that a high quality display substrate without deterioration of the electrode, breakage or the like can be provided.

The transparent electrode used in the present invention can either be an anode or a cathode as long as it is an electrode layer which is transparent to the visible light, and it can be selected optionally according to the applications of the display substrate of the present invention.

As such an anode, specifically, an indium tin oxide (ITO), an indium zinc oxide (IZO) or the like can be used preferably. Moreover, these transparent electrode layers can be formed by a vacuum deposition method, a sputtering method, a PVD method such as an ion plating method or the like.

Here, the film thickness of the transparent electrode layer used in the present invention is preferably in the range of about 50 nm to 500 nm. Moreover, when it is thinner than the film thickness of the transparent electrode layer, the conductivity is lowered, and furthermore, when the film thickness of the transparent electrode layer is thicker than the range, the conductivity is deteriorated due to cracking of the conductive film or the like while progressing of the post process, and thus it is not preferable.

D. Organic EL Display Substrate

Next, the organic EL display substrate of the present invention will be explained. The organic EL display substrate of the present invention comprises a transparent electrode layer formed on the organic EL device substrate.

According to the present invention, since the organic EL device substrate having a high gas barrier property and a high flatness is used, an organic EL display substrate which is not having breakage of the transparent electrode layer or the like, and is capable of forming an even organic EL layer such as a light emitting layer on the organic EL display substrate can be provided.

Since the transparent electrode layer used in the present invention is same as that mentioned in the "C. Display substrate", explanation is omitted here.

E. Organic EL Device

Next, the organic EL device of the present invention will be explained. The layer configuration or the like of the organic EL device of the present invention is not particularly limited as long as it comprises an organic EL layer formed on the transparent electrode layer of the organic EL display substrate and a counter electrode formed on the organic EL layer, and it can be selected optionally according to the application or the like of the organic EL device.

According to the present invention, since the organic EL layer or the like is formed on the organic EL display substrate using the organic EL device substrate having a high flatness and a high gas barrier property, a high quality organic EL device capable of forming the organic EL layer or the like evenly without suffering the influence of the oxygen, the water vapor or the like due to the time passage can be provided.

The organic EL device of the present invention comprises an organic EL layer formed between a transparent electrode layer formed on the organic EL display substrate, and a counter electrode having an electrode opposite to that of the transparent electrode, formed facing the thereto. Here, as the organic EL layer in the present invention, those used usually for the organic EL device can be used, and they comprise one or a plurality of organic layers including at least a light emitting layer. That is, the organic EL layer is a layer including at least a light emitting layer, with the layer configuration of one or more organic layers. In general, in the case of forming the organic EL layer by a wet method by coating, since a large number of layers can hardly be laminated due to the interaction to the solvent, it comprises one or two layers of organic layers in most cases, however, by skillfully providing the organic material or combining a vacuum deposition method, a larger number of layers can be formed.

As the organic layer formed in the organic EL layer in addition to the light emitting layer, layers usually used for the organic EL layer can be used. For example, a charge injection layer such as a hole injection layer and an electron injection layer can be presented. Furthermore, as the other organic layers, a charge transporting layer such as a hole transporting layer for transporting the hole to the light emitting layer, and an electron transporting layer for transporting the electron to the light emitting layer can be presented. In general, these are formed integrally with the charge injection layer by providing the function of the charge transportation to the charge injection layer in most cases. Additionally, as the organic layer to be formed in the EL layer, a layer for preventing piercing through of the hole or the electron for improving the re-coupling efficiency such as a carrier blocking layer or the like can be presented.

Moreover, the organic EL device of the present invention may comprise an organic EL layer formed on the transparent electrode layer of the display substrate and a counter electrode formed on the organic EL layer.

The present invention is not limited to the embodiments. The above-mentioned embodiments are examples, and any one having the substantially same configuration as the technological concept mentioned in the claims of the present invention and providing the same effects can be included in the technological scope of the present invention.

EXAMPLES

Hereinafter, with reference to the examples and the comparative examples, the present invention will be explained further specifically.

Example 1

Production of the Gas Barrier Substrate Comprising Base Material/Transparent Resin Layer/Gas Barrier Layer/Planarization Layer A transparent layer was formed by coating a (meth) acrylic based resin (resin composition made of 94 parts by weight of a bis(meth)acrylate including alicyclic core structure and 6 parts by weight of a mono(meth)acrylate including alicyclic core structure) on a sheet like (30 cm×21 cm) polycarbonate resin base material by a spin coating method by a 1.0 μm film thickness, drying at 120° C. for 2 minutes by a hot plate, irradiating a UV by a 1 J/cm$^2$, and drying at 160° C. for 60 minutes by hot air. The base material with the transparent resin layer formed has a 63 ppm of coefficient of thermal expansion and 89% of overall optical transmittance.

The base material obtained in the process was disposed in the chamber of a magnetron sputtering device. A gas barrier layer was deposited on the base material by forming a film using a silicon nitride as the target under the below-mentioned film forming conditions until the film thickness of the silicon nitride oxide became 100 nm.

Film forming pressure: 2.5×10$^{-1}$ Pa
    Argon gas flow rate: 20 sccm
    Nitrogen gas flow rate: 9 sccm
    Frequency: 13.56 MHz
    Electric power: 1.2 kW Thereafter, a planarization layer was formed by coating a coating agent containing a cardo polymer as the main agent (V-259-EH: produced by Nippon Steel Chemical Co., Ltd.) on the gas barrier layer by a spin coating method by a 1.0 μm film thickness, and drying at 120° C. for 2 minutes, and then at 160° C. for 60 minutes by hot air.

Example 2

Production of a Gas Barrier Substrate Comprising Base Material/Gas Barrier Layer (Ion Plating Method)/Planarization Layer A sheet like (30 cm×21 cm) (meth)acrylic based resin (resin composition made of 94 parts by weight of a bis(meth) acrylate including alicyclic core structure and 6 parts by weight of a mono(meth)acrylate including alicyclic core structure) film (the coefficient of thermal expansion is 60 ppm, and the overall optical transmittance is 86%) was disposed in the chamber of an ion plating device as the base material. A gas barrier layer was deposited on the base material by forming a film using a silicon nitride as the sublimation material under the below-mentioned film forming conditions until the film thickness of the silicon nitride oxide became 100 nm.

Film forming pressure: 1.5×10−1Pa

Argon gas flow rate: 12 sccm

Nitrogen gas flow rate: 20 scan

Film forming electric current value: 100 A

A planarization layer was formed by coating a coating agent containing a fluorene as the main agent (V-259-EH: produced by Nippon Steel Chemical Co., Ltd.) on the gas barrier layer formed in the process by a spin coating method by a 1.0 μm film thickness, and drying at 120° C. for 2 minutes, and then at 160° C. for 60 minutes by hot air.

Production of a Gas Barrier Substrate Comprising Base Material/Gas Barrier Layer (CVD Method)/Planarization Layer A sheet like (30 cm×21 cm) (meth)acrylic based resin (resin composition made of 94 parts by weight of a bis(meth) acrylate including alicyclic core structure and 6 parts by weight of a mono(meth)acrylate including alicyclic core structure) film (the coefficient of thermal expansion is 60 ppm, and the overall optical transmittance is 86%) was disposed in a plasma chemical gas phase deposition (CVD) device as the base material. A gas barrier layer comprising a metal oxide film was deposited by forming a film using a hexamethyl disiloxane (HMDSO) as the material under the below-mentioned film forming conditions until the film thickness became 100 nm.

Film forming pressure: 30 Pa

Hexamethyldisiloxane gas flow rate: 4 sccm

Oxygen gas flow rate: 12 sccm

Herium gas flow rate: 30 sccm

Frequency: 0 kHz

Electric power: 150 W

A planarization layer was formed by coating a coating agent containing a cardo polymer as the main agent (V-259-EH: produced by Nippon Steel Chemical Co., Ltd.) on the gas barrier layer formed in the process by a spin coating method by a 1.0 μm film thickness, and drying at 120° C. for 2 minutes, and then at 160° C. for 60 minutes by hot air.

Example 4

Production of a Gas Barrier Substrate Comprising Base Material/Gas Barrier Layer (Sputtering Method)/Planarization Layer A sheet like (30 cm×21 cm) (meth) acrylic based resin (resin composition made of 94 parts by weight of a bis(meth) acrylate including alicyclic core structure and 6 parts by weight of a mono(meth)acrylate including alicyclic core structure) film (the coefficient of thermal expansion is 60 ppm, and the overall optical transmittance is 86%) was disposed in the chamber of a magnetron sputtering device as the base material. A gas barrier layer was deposited on the base material by forming a film using a silicon nitride as the target under the below-mentioned film forming conditions until the film thickness of the silicon nitride oxide became 100 nm.
Film forming pressure: $2.5 \times 10^{-1}$ Pa
Argon gas flow rate: 20 sccm
Nitrogen gas flow rate: 9 sccm
Frequency: 13.56 MHz
Electric power: 1.2 kW A planarization layer was formed by coating a coating agent containing a cardo polymer as the main agent (V-259-EH: produced by Nippon Steel Chemical Co., Ltd.) on the gas barrier layer formed in the process by a spin coating method by a 1.0 μm film thickness, and drying at 120° C. for 2 minutes, and then at 160° C. for 60 minutes by hot air.

Example 5

Production of a Gas Barrier Substrate Comprising Base Material/Gas Barrier Layer/Planarization Layer/Gas Barrier Layer The gas barrier substrate obtained in the example 4 was disposed in the chamber of a magnetron sputtering device. A gas barrier layer was deposited by forming a film using a silicon nitride as the target under the below-mentioned film forming conditions until the film thickness of the silicon nitride oxide became 100 nm.
Film forming pressure: $2.5 \times 10^{-1}$ Pa
Argon gas flow rate: 20 sccm
Nitrogen gas flow rate: 9 sccm
Frequency: 13.56 MHz
Electric power: 1.2 kW

Example 6

Production of a Gas Barrier Substrate Comprising Base Material/Planarization Layer/Gas Barrier Layer A planarization layer was formed on a sheet like (30 cm×21 cm) (meth) acrylic based resin (resin composition made of 94 parts by weight of a bis(meth)acrylate including alicyclic core structure and 6 parts by weight of a mono(meth)acrylate including alicyclic core structure) film (the coefficient of thermal expansion is 60 ppm, and the overall optical transmittance is 86%) as the base material by coating a coating agent containing a cardo polymer as the main agent (V-259-EH: produced by Nippon Steel Chemical Co., Ltd.) thereon by a spin coating method by a 1.0 μm film thickness, and drying at 120° C. for 2 minutes, and then at 160° C. for 60 minutes by hot air. The transparent substrate with the planarization layer formed by the process was disposed in the chamber of a magnetron sputtering device. A gas barrier layer was deposited on the planarization layer by forming a film using a silicon nitride as the target under the below-mentioned film forming conditions until the film thickness of the silicon nitride oxide became 100 nm.
Film forming pressure: $2.5 \times 10^{-1}$ Pa
Argon gas flow rate: 20 sccm
Nitrogen gas flow rate: 9 sccm
Frequency: 13.56 MHz
Electric power: 1.2 kW

Example 7

Production of a Gas Barrier Substrate Comprising A Stress Releasing Layer Provided on the Opposite Surface to the Film Forming Side A sheet like (30 cm×21 cm) (meth)acrylic based resin (resin composition made of 94 parts by weight of a bis(meth) acrylate including alicyclic core structure and 6 parts by weight of a mono(meth)acrylate including alicyclic core structure) film (the coefficient of thermal expansion is 60 ppm, and the overall optical transmittance is 86%) with a 100 nm film thickness silicon nitride oxide provided as a stress releasing layer provided on the opposite side (rear surface) of the film forming surface was disposed in the chamber of a magnetron sputtering device as the base material. A gas barrier layer was deposited by forming a film using a silicon nitride as the target under the below-mentioned film forming conditions until the film thickness of the silicon nitride oxide became 100 nm.
Film forming pressure: $2.5 \times 10^{-1}$ Pa
Argon gas flow rate: 20 sccm
Nitrogen gas flow rate: 9 sccm
Frequency: 13.56 MHz
Electric power: 1.2 kW Next, the film forming surface side (front surface) of the (meth) acrylic based resin film base material was set in the chamber of the magnetron sputtering device. A gas barrier layer was deposited by forming a film using a silicon nitride as the target under the below-mentioned film forming conditions until the film thickness of the silicon nitride oxide became 100 nm.
Film forming pressure: $2.5 \times 10^{-1}$ Pa
Argon gas flow rate: 20 sccm
Nitrogen gas flow rate: 9 sccm
Frequency: 13.56 MHz
Electric power: 1.2 kW A planarization layer was formed by coating a coating agent containing a cardo polymer as the main agent (V-259-EH: produced by Nippon Steel Chemical Co., Ltd.) on the gas barrier layer of the film forming surface side (front surface) by a spin coating method by a 1.0 μm film thickness, and drying at 120° C. for 2 minutes, and then at 160° C. for 60 minutes by hot air.

Furthermore, the base material with the flattering layer was disposed in the chamber of the magnetron sputtering device. A gas barrier layer was deposited by forming a film using a silicon nitride as the target under the below-mentioned film forming conditions until the film thickness of the silicon nitride oxide became 100 nm.
Film forming pressure: $2.5 \times 10^{-1}$ Pa
Argon gas flow rate: 20 sccm
Nitrogen gas flow rate: 9 sccm
Frequency: 13.56 MHz
Electric power: 1.2 kW

Example 8

Production of a Display Substrate

A sheet like (30 cm×21 cm) (meth) acrylic based resin (resin composition made of 94 parts by weight of a bis(meth)acrylate including alicyclic core structure and 6 parts by weight of a mono(meth)acrylate including alicyclic core structure) film (the coefficient of thermal expansion is 60 ppm, and the overall optical transmittance is 86%) was disposed in the chamber of a magnetron sputtering device as the base material. A gas barrier layer was deposited by forming a film using a silicon nitride as the target under the below-mentioned film forming conditions until the film thickness of the silicon nitride oxide became 100 nm.

Film forming pressure: $2.5\times10^{-1}$ Pa
Argon gas flow rate: 20 sccm
Nitrogen gas flow rate: 9 sccm
Frequency: 13.56 MHz
Electric power: 1.2 kW A planarization layer was formed by coating a coating agent containing a cardo polymer as the main agent (V-259-EH: produced by Nippon Steel Chemical Co., Ltd.) on the gas barrier layer by a spin coating method by a 1.0 μm film thickness, and drying at 120° C. for 2 minutes, and then at 160° C. for 60 minutes by hot air.

The gas barrier substrate obtained in the process was disposed in the chamber of the magnetron sputtering device. A gas barrier layer was deposited by forming a film using a silicon nitride as the target under the below-mentioned film forming conditions until the film thickness of the silicon nitride oxide became 100 nm.

Film forming pressure: $2.5\times10^{-1}$ Pa
Argon gas flow rate: 20 sccm
Nitrogen gas flow rate: 9 sccm
Frequency: 13.56 MHz
Electric power: 1.2 kW The laminated product obtained in the process was disposed in the chamber of the ion plating device. A transparent electrode layer was formed by forming a film using an indium tin oxide (ITO) as the sublimation material under the below-mentioned film forming conditions until the film thickness of the indium tin oxide (ITO) became 150 nm.

Film forming pressure: $1.5\times10^{-1}$ Pa
Argon gas flow rate: 18 sccm
Oxygen gas flow rate: 28 sccm
Film forming electric current value: 60 A

Example 9

Production of an Organic EL Device

A 6 inch glass was disposed in the chamber of a magnetron sputtering device as the base material. A gas barrier layer was deposited by forming a film using a silicon nitride as the target under the below-mentioned film forming conditions until the film thickness of the silicon nitride oxide became 100 nm.

Film forming pressure: $2.5\times10^{-1}$ Pa
Argon gas flow rate: 20 sccm
Nitrogen gas flow rate: 9 sccm
Frequency: 13.56 MHz
Electric power: 1.2 kW A planarization layer was formed by coating a cardo polymer (V-259-EH: produced by Nippon Steel Chemical Co., Ltd.) on the gas barrier layer by a spin coating method by a 1.0 μm film thickness, and drying at 120° C. for 2 minutes, and then at 160° C. for 60 minutes by hot air.

Subsequently, the substrate with the planarization layer was disposed in the chamber of the magnetron sputtering device. A gas barrier substrate with a gas barrier layer was obtained by forming a film using a silicon nitride as the target under the below-mentioned film forming conditions until the film thickness of the silicon nitride oxide became 100 nm.

Film forming pressure: $2.5\times10^{-1}$ Pa
Argon gas flow rate: 20 sccm
Nitrogen gas flow rate: 9 sccm
Frequency: 13.56 MHz
Electric power: 1.2 kW The gas barrier substrate obtained in the process was disposed in the chamber of the ion plating device. A display substrate with a transparent electrode layer was obtained by forming a film using an indium tin oxide (ITO) as the sublimation material under the below-mentioned film forming conditions until the film thickness of the indium tin oxide (ITO) became 150 nm.

Film forming pressure: $1.5\times10^{-1}$ Pa
Argon gas flow rate: 18 sccm
Oxygen gas flow rate: 28 sccm
Film forming electric current value: 60 A Onto the display substrate produced as mentioned above, an organic EL light emitting device having a 6 layer configuration comprising transparent electrode layer/hole injection layer/hole transporting layer/organic light emitting layer/electron injection layer/cathode was formed as follows.

That is, a transparent electrode layer with a stripe pattern of a 0.094 mm width, a 0.016 mm gap and a 100 nm film thickness was obtained by coating a resist agent "OFRP-800" (product name, produced by Tokyo Ohka Kogyo Co., Ltd.) onto the transparent electrode layer of an indium tin oxide, and patterning by a photolithography method.

Then, with the display substrate having the transparent electrode layer mounted in a resistance heating deposition device, a hole injection layer, a hole transporting layer, an organic light emitting layer and an electron injection layer were formed on the entire surface successively while maintaining a vacuum. When the film is formed, the vacuum vessel internal pressure was reduced to $1\times10^{-4}$ Pa. As the hole injection layer, a copper phthalocyanine (CuPc) was laminated until the film thickness became 100 nm. As the hole transporting layer, a 4,4'-bis [N-(1-naphthyl)-N-phenyl amino] biphenyl (α-NPD) was laminated until the film thickness became 20 nm. As the organic light emitting layer, a 4,4'-bis (2,2'-diphenylvinyl) biphenyl (DPVBi) was laminated until the film thickness became 30 nm. As the electron injection layer, an aluminum chelate (tris(8-hydroxy quinoline) aluminum complex, Alq) was laminated until the film thickness became 20 nm.

Next, while maintaining a vacuum, a 200 nm thickness cathode comprising an Mg/Ag (mass ratio 10/1) layer was formed using a mask for obtaining a 0.30 mm width and 0.03 mm interval pattern orthogonal to the stripe pattern of an anode (transparent electrode layer). A color organic EL device was obtained by placing the organic EL light emitting device under a dry nitrogen atmosphere (oxygen and water content concentrations both are 10 ppm or less) in a glove box, and sealing it with the gas barrier substrate produced in the example 7 by using a UV hardening adhesive.

After driving the obtained color organic EL device continuously for 100 hours, the number of dark spots per unit area in the panel was measured.

Example 10

Production of an Organic EL Device

A supporting substrate was obtained by coating a (meth) acrylic based resin (resin composition made of 94 parts by weight of a bis(meth)acrylate including alicyclic core structure and 6 parts by weight of a mono(meth)acrylate including alicyclic core structure) on a 6 inch glass by a spin coating method by a 1.0 µm film thickness, drying at 120° C. for 2 minutes by a hot plate, irradiating a UV by a 1 J/cm$^2$, and drying at 160° C. for 60 minutes by hot air.

The supporting substrate obtained in the previous process was disposed in the chamber of a magnetron sputtering device. A gas barrier layer was deposited by forming a film using a silicon nitride as the target under the below-mentioned film forming conditions until the film thickness of the silicon nitride oxide became 100 nm.
Film forming pressure: $2.5 \times 10^{-1}$ Pa
Argon gas flow rate: 20 sccm
Nitrogen gas flow rate: 9 sccm
Frequency: 13.56 MHz
Electric power: 1.2 kW A planarization layer was formed by coating a cardo polymer (V-259-EH: produced by Nippon Steel Chemical Co., Ltd.) on the gas barrier layer by a spin coating method by a 1.0 pm film thickness, and drying at 120° C. for 2 minutes, and then at 160° C. for 60 minutes by hot air.

The substrate with the planarization layer was disposed in the chamber of the magnetron sputtering device. A gas barrier layer was deposited by forming a film using a silicon nitride as the target under the below-mentioned film forming conditions until the film thickness of the silicon nitride oxide became 100 nm.
Film forming pressure: $2.5 \times 10^{-1}$ Pa
Argon gas flow rate: 20 sccm
Nitrogen gas flow rate: 9 sccm
Frequency: 13.56 MHz
Electric power: 1.2 kW Thereafter, the substrate was disposed in the chamber of the ion plating device. A transparent electrode layer was formed by forming a film using an indium t in oxide (ITO) as the sublimation material under the below-mentioned film forming conditions until the film thickness of the indium tin oxide (ITO) became 150 nm.
Film forming pressure: $1.5 \times 10^{-1}$ Pa
Argon gas flow rate: 18 sccm
Oxygen gas flow rate: 28 sccm
Film forming electric current value: 60 A Onto the substrate having a transparent electrode layer produced as mentioned above, an organic EL light emitting device having a 6 layer configuration comprising transparent electrode layer/hole injection layer/hole transporting layer/organic light emitting layer/electron injection layer/cathode was formed by successively forming a hole injection layer, a hole transporting layer, an organic light emitting layer, an electron injection layer and a cathode as follows.

That is, a transparent electrode layer with a stripe pattern of a 0.094 mm width, a 0.016 mm gap and a 100 nm film thickness formed was obtained by coating a resist agent "OFRP-800" (product name, produced by Tokyo Ohka Kogyo Co., Ltd.) onto the transparent electrode layer of an indium tin oxide obtained in the process, and patterning by a photolithography method.

With the substrate having the transparent electrode layer mounted in a resistance heating deposition device, a hole injection layer, a hole transporting layer, an organic light emitting layer and an electron injection layer were formed on the entire surface successively while maintaining a vacuum. When the film is formed, the vacuum vessel internal pressure was reduced to $1 \times 10-4$ Pa. As the hole injection layer, a copper phthalocyanine (CuPc) was laminated until the film thickness became 100 nm. As the hole transporting layer, a 4,4'-bis [N-b 1-naphthyl)-N-phenyl amino]biphenyl (α-NPD) was laminated until the film thickness became 20 nm. As the organic light emitting layer, a 4,4'-bis(2,2'-diphenylvinyl) biphenyl (DPVBi) was laminated until the film thickness became 30 nm. As the electron injection layer, an aluminum chelate(tris(8-hydroxyquinoline) aluminum complex, Alq) was laminated until the film thickness became 20 nm.

Next, while maintaining a vacuum, a 200 nm thickness cathode comprising an Mg/Ag (mass ratio 10/1) layer was formed using a mask for obtaining a 0.30 mm width and 0.03 mm interval pattern orthogonal to the stripe pattern of an anode (transparent electrode layer). A color organic EL device was obtained by placing the organic EL light emitting device under a dry nitrogen atmosphere (oxygen and water content concentrations both are 10 ppm or less) in a glove box, and sealing it with the gas barrier substrate produced in the example 7 by using a UV hardening adhesive.

After driving the obtained color organic EL device continuously for 100 hours, the number of dark spots per unit area in the panel was measured.

Comparative Example 1

Production of a Gas Barrier Substrate Comprising Base Material/Transparent Resin Layer/Gas Barrier Layer A gas barrier substrate of the comparative example 1 was obtained in the same manner as the example 1 except that the planarization layer was not formed in the production of the gas barrier substrate of the example 1.

Comparative Example 2

Production of a Gas Barrier Substrate Comprising Base Material/Transparent Resin Layer/Gas Barrier Layer A gas barrier substrate of the comparative example 2 was obtained in the same manner as in the example 2 except that the planarization layer was not formed in the production of the gas barrier substrate of the example 2.

Comparative Example 3

Production of a Gas Barrier Substrate Comprising Base Material/Gas Barrier Layer (CVD Method)

A gas barrier substrate of the comparative example 3 was obtained in the same manner as in the example 3 except that the planarization layer was not formed in the production of the gas barrier substrate of the example 3.

Comparative Example 4

Production of a Gas Barrier Substrate Comprising Base Material/Gas Barrier Layer (Sputtering Method)

A gas barrier substrate of the comparative example 4 was obtained in the same manner as in the example 4 except that the planarization layer was not formed in the production of the gas barrier substrate of the example 4.

Comparative Example 5

Production of a Gas Barrier Substrate Comprising Base Material/Gas Barrier Layer/Gas Barrier Layer A gas barrier substrate of the comparative example 5 was obtained in the same manner as in the example 5 except that the planarization layer was not formed in the production of the gas barrier substrate of the example 5. That is, the gas barrier substrate of the comparative example 5 is a gas barrier substrate comprising a gas barrier layer of a silicon nitride oxide formed by two layers in the same conditions on the base material.

Comparative Example 6

Production of a Gas Barrier Substrate with a Stress Releasing Layer Provided on the Opposite Surface to the Film Forming Side A gas barrier substrate of the comparative example 6 was obtained in the same manner as in the example 7 except that the planarization layer was not formed in the production of the gas barrier substrate of the example 6. That is, the layer configuration of the gas barrier substrate obtained in the comparative example 6 comprises a stress releasing layer comprises a gas barrier layer/a base material/a gas barrier layer/a gas barrier layer.

Comparative Example 7

Display Substrate

A gas barrier substrate of the comparative example 7 was obtained in the same manner as in the example 8 except that the planarization layer was not formed in the production of the gas barrier substrate of the example 7. That is, the layer configuration of the display substrate obtained in the comparative example 7 comprises a base material/a gas barrier layer/a gas barrier layer/a transparent electrode layer.

Comparative Example 8

Production of a Gas Barrier Substrate Comprising Base Material/Gas Barrier Layer/Planarization Layer A gas barrier layer was deposited on the base material in the same manner as in the example 8.

A planarization layer was formed by coating a coating agent containing an amino alkyldialkoxysilane as the main agent on the gas barrier layer by a spin coating method by a 1.0 μm film thickness, and drying at 120° C. for 2 minutes, and then at 200° C. for 2 hours by hot air.

Comparative Example 9

Production of an Organic EL Device

A 6 inch glass was disposed in the chamber of a magnetron sputtering device as the base material. A gas barrier layer was deposited by forming a film using a silicon nitride as the target under the below-mentioned film forming conditions until the film thickness of the silicon nitride oxide became 100 nm.
Film forming pressure: $2.5 \times 10^{-1}$ Pa
Argon gas flow rate: 20 sccm
Nitrogen gas flow rate: 3 sccm
Frequency: 13.56 MHz
Electric power: 1.2 kW The base material with the gas barrier layer was disposed in the chamber of the magnetron sputtering device. A gas barrier substrate with a gas barrier layer formed was obtained by forming a film using a silicon nitride as the target under the below-mentioned film forming conditions until the film thickness of the silicon nitride oxide became 100 nm.
Film forming pressure: $1.5 \times 10^{-1}$ Pa
Argon gas flow rate: 20 sccm
Nitrogen gas flow rate: 9 sccm
Frequency: 13.56 MHz
Electric power: 1.2 kW
Film forming electric current value: 100 A A display substrate was obtained by forming a transparent electrode layer on the gas barrier substrate obtained in the process in the same manner as in the example 9.

A color organic EL device was obtained by forming an organic EL light emitting device having a 6 layer configuration comprising transparent electrode layer/hole injection layer/hole transporting layer/organic light emitting layer/electron injection layer/cathode onto the display substrate obtained in the process in the same manner as in the above-mentioned example 9, forming a cathode and sealing.

After driving the obtained color organic EL device continuously for 100 hours, the number of dark spots per unit area in the panel was measured.

Comparative Example 10

Production of an Organic EL Device

A transparent supporting substrate was prepared as follows. That is, a transparent supporting substrate was obtained by coating a (meth) acrylic based resin film on a 6 inch glass by a spin coating method by a 1.0 μm film thickness, drying at 120° C. for 2 minutes by a hot plate, irradiating an ultraviolet ray (UV) by a 1 J/cm$^2$, and drying at 160° C. for 60 minutes by hot air.

The transparent supporting substrate obtained in the process was disposed in the chamber of a magnetron sputtering device. A gas barrier layer was deposited on the transparent supporting substrate by forming a film using a silicon nitride as the target under the below-mentioned film forming conditions until the film thickness of the silicon nitride oxide became 100 nm.
Film forming pressure: $2.5 \times 10^{-1}$ Pa
Argon gas flow rate: 20 sccm
Nitrogen gas flow rate: 9 sccm
Frequency: 13.56 MHz
Electric power: 1.2 kW The substrate with the gas barrier layer was disposed in the chamber of the magnetron sputtering device. A gas barrier substrate with a gas barrier layer was obtained by forming a film using a silicon nitride as the target under the below-mentioned film forming conditions until the film thickness of the silicon nitride oxide became 100 nmn.
Film forming pressure: $2.5 \times 10^{-1}$ Pa
Argon gas flow rate: 20 sccm
Oxygen gas flow rate: 3 sccm
Frequency: 13.56 MHz
Electric power: 1.2 kW The gas barrier substrate was disposed in the chamber of the ion plating device. A display substrate was obtained by forming a transparent electrode layer by forming a film using an indium tin oxide (ITO) as the sublimation material under the below-mentioned film forming conditions until the film thickness of the indium tin oxide (ITO) became 150 nm.
Film forming pressure: $1.5 \times 10^{-1}$ Pa
Argon gas flow rate: 18 sccm Oxygen gas flow rate: 28 sccm Film forming electric current value: 60 A Onto the display substrate produced as mentioned above, an organic EL light emitting device having a 6 layer configuration comprising transparent electrode layer/hole injection layer/hole transporting layer/organic light emitting layer/electron injection layer/cathode was formed as follows.

That is, a transparent electrode layer with a stripe pattern of a 0.094 mm width, a 0.016 mm gap and a 100 nm film thickness formed was obtained by coating a resist agent "OFRP-800" (product name, produced by Tokyo Ohka Kogyo Co., Ltd.) onto the transparent electrode layer of an indium tin oxide, and patterning by a photolithography method.

With the substrate having the transparent electrode layer formed mounted in a resistance heating deposition device, a hole injection layer, a hole transporting layer, an organic light emitting layer and an electron injection layer were faulted on the entire surface successively while maintaining a vacuum. When the film is formed, the vacuum vessel internal pressure was reduced to $1 \times 10^{-4}$ Pa. As the hole injection layer, a copper phthalocyanine (CuPc) was laminated until the film thickness became 100 nm. As the hole transporting layer, a 4,4'-bis [N-(1-naphthyl)-N-phenylamino]biphenyl ($\alpha$-NPD) was laminated until the film thickness became 20 nm. As the organic light emitting layer, a 4,4'-bis(2,2'-diphenylvinyl) biphenyl (DPVBi) was laminated until the film thickness became 30 nm. As the electron injection layer, an aluminum chelate (tris(8-hydroxyquinoline) aluminum complex, Alq) was laminated until the film thickness became 20 nm.

Next, while maintaining a vacuum, a 200 nm thickness cathode comprising an Mg/Ag (mass ratio 10/1) layer was formed using a mask for obtaining a 0.30 mm width and 0.03 mm interval pattern orthogonal to the stripe pattern of an anode (transparent electrode layer). A color organic EL device was obtained by placing the organic EL light emitting device under a dry nitrogen atmosphere (oxygen and water content concentrations both are 10 ppm or less) in a glove box, and sealing it with the gas barrier substrate produced in the example 7 by using UV hardening adhesive.

After driving the obtained color organic EL device continuously for 100 hours, the number of dark spots per unit area in the panel was measured.

[Evaluation Method]

For the gas barrier substrates and the display substrates produced in the examples 1 to 10 and comparative examples 1 to 10, tests were executed for the evaluation items shown below and the data were measured.

(1) Measurement of the Water Vapor Transmission Rate

It was measured by a water vapor transmission rate measuring device (produced by MOCON, PERMATRAN-W 3/31: product name) under the conditions of the measurement temperature 37.8° C., and the humidity 100% Rh.

(2) Measurement of the Oxygen Transmission Rate

It was measured by an oxygen gas transmission rate measuring device (produced by MOCON, OX-TRAN 2/20: product name) under the conditions of the measurement temperature 23° C., and the humidity 90% Rh.

(3) Measurement of the Average Surface Roughness (Ra) and the Maximum Height Difference of Surface (Peak to Valley)

They were measured by (Nanopics: product name, produced by Seiko Instruments Inc.) under the conditions of a 20 µm of scanning range and a 90 sec/frame of scanning speed.

(4) Measurement of the Sheet Resistance Value

It was measured by a surface electric resistance measuring device (LORESTA AP: product name, produced by Mitsubishi Yuka Corp.) by a four probe method.

(5) Measurement of the Coefficient of Thermal Expansion

The coefficient of thermal expansion was measured at 25 to 200° C. using TMA 8310 (product name) produced by Rigaku Corporation.

(6) Measurement of the Overall Optical Transmittance

The overall optical transmittance was measured by an overall optical transmittance device (COLOUR S&M COMPUTER MODEL SM-C: model number) produced by Suga Test Instruments Co., Ltd.

The above-mentioned evaluation results (measurement results) are shown in the following Table 1.

TABLE 1

| | Water vapor transmission rate ($g/m^2/day$) | Oxygen transmission rate ($cc/m^2/day \cdot atm$) | Average surface roughness (Ra) (nm) | Maximum height difference of surface (peak to valley) (nm) | Overall optical transmittance (%) | Sheet resistance value ($\Sigma/\square$) | Dark spot (piece) |
|---|---|---|---|---|---|---|---|
| Example 1 | 0.08 | 0.08 | 0.5 | 5 | 88 | — | — |
| Example 2 | 0.07 | 0.09 | 0.6 | 6 | 87 | — | — |
| Example 3 | 0.06 | 0.07 | 0.6 | 5 | 88 | — | — |
| Example 4 | 0.02 | 0.05 | 0.5 | 5 | 88 | — | — |
| Example 5 | 0.001 | 0.003 | 2 | 25 | 85 | — | — |
| Example 6 | 0.001 | 0.004 | 1.5 | 18 | 80 | — | — |
| Example 7 | 0.0005 | 0.002 | 1.9 | 22 | 80 | — | — |
| Example 8 | 0.005 | 0.007 | 1.1 | 10 | 80 | 10 | — |
| Example 9 | — | — | — | — | — | — | 0.45 ± 0.2 |
| Example 10 | — | — | — | — | — | — | 0.61 ± 0.3 |
| Comparative example 1 | 1.0 | 1.4 | 6.5 | 70 | 85 | — | — |
| Comparative example 2 | 0.8 | 0.9 | 7.8 | 80 | 88 | — | — |
| Comparative example 3 | 0.9 | 0.6 | 6.1 | 70 | 88 | — | — |
| Comparative example 4 | 0.5 | 0.5 | 6.1 | 72 | 85 | — | — |
| Comparative example 5 | 0.4 | 0.5 | 8.2 | 100 | 75 | — | — |
| Comparative example 6 | 0.04 | 0.3 | 8.3 | 95 | 75 | — | — |
| Comparative example 7 | 0.2 | 0.2 | 10 | 110 | 80 | 35 | — |
| Comparative example 8 | 1 | 0.8 | 6.3 | 72 | 80 | — | — |
| Comparative example 9 | — | — | — | — | — | — | 3.1 ± 0.3 |
| Comparative example 10 | — | — | — | — | — | — | 3.4 ± 0.2 |

Example 11

Formation of a Blue Color Filter Layer

As a transparent substrate, a sheet like (30 cm×21 cm) (meth) acrylic based resin film having a 60 ppm of coefficient of thermal expansion, a 85% of overall optical transmittance and a 200 μm of thickness was used. The (meth) acrylic based resin film was produced by forming a resin composition made of 94 parts by weight of a bis(meth)acrylate including alicyclic core structure and 6 parts by weight of a mono(meth)acrylate including alicyclic core structure.

A blue filter material (color mosaic CB-7001: product name, produced by Fuji Hunt Electronics Technology Co., Ltd.) was coated onto the (meth) acrylic based resin film by a spin, coating method. A blue color filter layer having a 0.1 mm line width, a 0.33 mm pitches (cycle) and a 6 μm film thickness stripe pattern was formed by patterning the coating film by a photolithography method.

Formation of a Green Color Conversion Layer

As a fluorescent pigment, a coumarin 6 (0.7 part by weight) was dissolved in 120 parts by weight of a propyleneglycolmonoethyl acetate (PEGMA) as the solvent. A coating solution was obtained by adding, into the solution, 100 parts by weight of (V-259PA/PH5: product name, produced by Nippon Steel Chemical Co., Ltd.) as the photopolymerizable resin.

A green color conversion layer having a 0.1 mm line width, a 0.33 mm pitch (cycle) and a 10 μm film thickness stripe pattern was formed by coating the coating solution prepared as mentioned above onto the transparent base material having the blue color filter layer obtained in the process, and patterning by a photolithography method.

Formation of a Red Color Conversion Layer

As a fluorescent pigment, a coumarin 6 (0.6 part by weight), a rhodamine 6G (0.3 part by weight) and basic violet 11 (0.3 part by weight) were dissolved in 120 parts by weight of a propyleneglycolmonoethyl acetate (PEGMA) as the solvent. A coating solution was obtained by adding, into the solution, 100 parts by weight of a photopolymerizable resin (V-259PA/PH5: product name, produced by Nippon Steel Chemical Co., Ltd.).

A red color conversion layer having a 0.1 mm line width, a 0.33 mm pitch (cycle) and a 10 μm film thickness stripe pattern was formed by coating the coating solution prepared as mentioned above onto the transparent base material having the blue color filter layer and the green color conversion layer, and patterning by a photolithography method.

The color conversion layers were formed with the line patterns of the red color conversion layer, the green color conversion layer and the blue color filter layer formed as mentioned above disposed parallel with a 0.01 mm gap width.

Formation of an Overcoat Layer

Next, an overcoat layer was formed on the color conversion layer formed in the process by coating an acrylic based resin (V-259PA/PH5: product name, produced by Nippon Steel Chemical Co., Ltd.) by a spin coating method, and irradiating an ultraviolet ray (300 mJ/cm$^2$) for hardening. The overcoat layer has 8 μm thickness on each color conversion layer.

Formation of a Gas Barrier Layer

The substrate having the overcoat layer obtained in the process was disposed in the chamber of a magnetron sputtering device. A film was deposited using a silicon nitride as the target under the below-mentioned film forming conditions until the film thickness of the silicon nitride oxide became 100 nm. Film forming pressure: $2.5 \times 10^{-1}$ Pa
Argon gas flow rate: 20 sccm
Nitrogen gas flow rate: 9 sccm
Frequency: 13.56 MHz
Electric power: 1.2 kW

Formation of a Flattering Layer

A resin made of a cardo polymer having a fluorene skeleton (V-259-EH: produced by Nippon Steel Chemical Co., Ltd.) was coated on the gas barrier layer by a spin coating method, and was heated at 160° C. for 1 hour. Thereby, an organic EL device substrate with a planarization layer formed was obtained. The above-mentioned planarization layer has a 1 μm thickness on the gas barrier layer. The gas barrier layer of the overcoat layer was not deformed, and the upper surface of the planarization layer has a 0.8 nm of surface roughness Ra and 8 nm of maximum height difference of surface (peak to valley).

Production of an Organic EL Color Display

Onto the organic EL device substrate produced as mentioned above, an organic EL light emitting device having a 6 layer configuration comprising transparent electrode layer/hole injection layer/hole transporting layer/organic light emitting layer/electron injection layer/cathode was formed as follows.

A transparent electrode (indium zinc oxide) was formed on the entire surface of the organic EL device substrate by a sputtering method. A transparent electrode layer with a stripe pattern of a 0.094 mm width, a 0.016 mm gap and a 100 nm film thickness formed at a position corresponding to the color conversion layers of each color was formed by coating a resist agent "OFRP-800" (product name, produced by Tokyo Ohka Kogyo Co., Ltd.) onto the indium zinc oxide, and patterning by a photolithography method.

Then, with the organic EL device substrate having the transparent electrode layer mounted in a resistance heating deposition device, a hole injection layer, a hole transporting layer, an organic light emitting layer and an electron injection layer were formed on the entire surface successively while maintaining a vacuum. When the film is formed, the vacuum vessel internal pressure was reduced to $1 \times 10^{-4}$ Pa. As the hole injection layer, a copperphthalocyanine (CuPc) was laminated until the film thickness became 100 nm. Moreover, as the hole transporting layer, a 4,4'-bis[N-(1-naphthyl)-N-phenylamino]biphenyl(∀-NPD) was laminated until the film thickness became 20 nm. As the organic light emitting layer, a 4,4'-bis(2,2'-diphenylvinyl)biphenyl (DPVBi) was laminated until the film thickness became 30 nm. As the electron injection layer, an aluminum chelate (tris(8-hydroxyquinoline) aluminum complex, Alq) was laminated until the film thickness became 20 nm.

Next, while maintaining a vacuum, a 200 nm thickness cathode comprising an Mg/Ag (mass ratio 10/1) layer was formed using a mask for obtaining a 0.30 mm width and 0.03 mm interval pattern orthogonal to the stripe pattern of an anode (transparent electrode layer). A color organic EL device was obtained by placing the organic EL light emitting device obtained accordingly under a dry nitrogen atmosphere (oxygen and water content concentrations both are 10 ppm or less) in a glove box, and sealing it with a sealing glass by using a UV hardening adhesive.

After driving the obtained color organic EL device continuously for 100 hours, the number of dark spots per unit area in the panel was measured. The results are shown in the following Table 2.

Example 12

It was executed in the same manner as in the example 11 except that the transparent base material was changed to the following.

A transparent base material was obtained by coating a (meth)acrylic based resin [resin composition made of 94 parts by weight of a bis(meth)acrylate including alicyclic core structure and 6 parts by weight of a mono(meth)acrylate including alicyclic core structure] on a 200:m thickness sheet like (30 cm×21 cm) polycarbonate resin film by a spin coating method by a 1.0 :m film thickness, drying at 120° C. for 2 minutes by a hot plate, irradiating a UV by a 1 J/cm$^2$, and drying at 160° C. for 60 minutes by hot air. The coefficient of thermal expansion was 63 ppm, and the overall optical transmittance was 89%.

Example 13

It was executed in the same manner as in the example 11 except that the transparent base material was changed to the following.

A transparent base material was obtained by coating a (meth)acrylic based resin [resin composition made of 94 parts by weight of a bis(meth)acrylate including alicyclic core structure and 6 parts by weight of a mono(meth)acrylate including alicyclic core structure] on a 6 inch square glass having a 0.7 mm thickness and a 87% of overall optical transmittance by a spin coating method by a 1.0:m film thickness, drying at 120° C. for 2 minutes by a hot plate, irradiating a UV by a 1 J/cm$^2$, and drying at 160° C. for 60 minutes by hot air. The coefficient of thermal expansion was 62 ppm, and the overall optical transmittance was 88%.

Example 14

It was executed in the same manner as in the example 11 except that the transparent base material was change to the following.

A 6 inch square glass substrate having a 0.7 mm thickness and 87% of overall optical transmittance was prepared and used as the transparent base material.

Example 15

It was executed in the same manner as in the example 11 except that the gas barrier layer was deposited by the following method.

Formation of a Gas Barrier Layer

The substrate with the overcoat layer was disposed in the chamber of the ion plating device. A film was deposited using a silicon oxide as the sublimation material under the below-mentioned film forming conditions until the film thickness of the silicon nitride oxide became 100 nm.
Film forming pressure: 1.5×10$^{-1}$ Pa
Argon gas flow rate: 18 sccm
Oxygen gas flow rate: 28 sccm
Film forming electric current value: 60 A Example 16

It was executed in the same manner as in the example 11 except that the gas barrier layer was deposited by the following method.

Formation of a Gas Barrier Layer

The substrate with the overcoat layer was disposed in a plasma enhanced chemical gas phase deposition device. A film was deposited using a tetramethoxysilane (TMOS) as the material under the below-mentioned film forming conditions until the film thickness became 100 nm.
Film forming pressure: 30 Pa
Tetramethoxysilane gas flow rate: 4 sccm
Oxygen gas flow rate: 12 sccm
Helium gas: 30 sccm
Frequency: 90 KHz
Electric power: 150 W Example 17

It was executed in the same manner as in the example 11 except that a gas barrier layer was deposited on the planarization layer by the following method.

Formation of a Gas Barrier Layer

The substrate with the overcoat layer was disposed in the chamber of a magnetron sputtering device. A film was deposited using a silicon nitride as the target under the below-mentioned film forming conditions until the film thickness of the silicon nitride oxide became 100 nm.
Film forming pressure: 2.5×10$^{-1}$ Pa
Argon gas flow rate: 20 sccm
Nitrogen gas flow rate: 9 sccm
Frequency: 13.56 MHz
Electric power: 1.2 kW Example 18

It was executed in the same manner as in the example 11 except that a stress releasing layer was formed on the transparent base material.

Formation of a Stress Releasing Layer

The below-mentioned gas barrier layer was deposited on the opposite side (rear surface) of the film forming surface of a transparent base material as a stress releasing and degassing preventing layer. That is, a sheet like (30 cm×21 cm) (meth) acrylic based resin film provided with a 100 nm film thickness silicon nitride oxide was disposed in the chamber of a magnetron sputtering device. A film was deposited using a silicon nitride as the target under the below-mentioned film forming conditions until the film thickness of the silicon nitride oxide became 100 nm.
Film forming pressure: 2.5×10$^{-1}$ Pa
Argon gas flow rate: 20 sccm
Nitrogen gas flow rate: 9 sccm
Frequency: 13.56 MHz
Electric power: 1.2 kW Comparative Example 11

It was executed in the same manner as in the example 11 except that the planarization layer was not formed.

Comparative Example 12

It was executed in the same manner as in the example 12 except that the planarization layer was not formed.

Comparative Example 13

It was executed in the same manner as in the example 13 except that the planarization layer was not formed.

Comparative Example 14

It was executed in the same manner as in the example 14 except that the planarization layer was not formed.

Comparative Example 15

It was executed in the same manner as in the example 15 except that the planarization layer was not formed.

Comparative Example 16

It was executed in the same manner as in the example 16 except that the planarization layer was not formed.

Comparative Example 17

It was executed in the same manner as in the example 17 except that the planarization layer was not formed.

Comparative Example 18

It was executed in the same manner as in the example 18 except that the planarization layer was not formed.

[Evaluation Method]

The organic EL devices obtained in the examples 11 to 18 and the comparative examples 11 to 18 were evaluated as follows. The organic EL devices were driven by line sequential scanning at a 60 Hz driving frequency, a 1/60 duty ratio and a 2 mA electric current amount per pixel. After driving the same for 100 hours continuously, the numbers of dark spots per unit area in the panels were compared.

TABLE 2

|  | Dark spot (piece) |
|---|---|
| Example 11 | 0.45 ± 0.2 |
| Example 12 | 0.47 ± 0.2 |
| Example 13 | 0.46 ± 0.2 |
| Example 14 | 0.49 ± 0.2 |
| Example 15 | 0.52 ± 0.2 |
| Example 16 | 0.51 ± 0.2 |
| Example 17 | 0.45 ± 0.2 |
| Example 18 | 0.51 ± 02 |
| Comparative example 11 | 3.3 ± 0.3 |
| Comparative example 12 | 3.1 ± 0.3 |
| Comparative example 13 | 4.2 ± 0.3 |
| Comparative example 14 | 3.1 ± 0.3 |
| Comparative example 15 | 3.3 ± 0.3 |
| Comparative example 16 | 3.1 ± 0.3 |
| Comparative example 17 | 3.2 ± 03 |
| Comparative example 18 | 3.1 ± 0.3 |

According to the Table 2, it was learned that generation and growth of the dark spots can be restrained by providing the planarization layer. As the dark spots, those having a 0.1 to 2 mm diameter were measured, and those having 2 mm or more were eliminated form the measurement subject as a defect matter.

What is claimed is:

1. A gas barrier substrate having a base material, a planarization layer having a cardo polymer and and a gas barrier layer comprising a deposition film formed on the planarization layer, wherein the base material is made of a heat resistant transparent resin having 80 ppm or less of coefficient of thermal expansion in the range from a room temperature to 150° C., and 85% or more of overall optical transmittance.

2. A gas barrier substrate having a base material, a planarization layer having a cardo polymer and formed on the base material, and a gas barrier layer comprising a deposition film formed on the planarization layer, wherein the base material has a heat resistant transparent resin layer having 80 ppm or less of coefficient of thermal expansion in the range from a room temperature to 150° C. and a 85% or more of overall optical transmittance of the surface.

3. A gas barrier substrate having a base material, a planarization layer having a cardo polymer and formed on the base material, and a gas barrier layer comprising a deposition film formed on the planarization layer, wherein the average surface roughness of the planarization layer is 6 nm or less, and the maximum height difference of surface (peak to valley) is 60 nm or less.

4. A gas barrier substrate having a base material, a planarization layer having a cardo polymer and formed on the base material, and a gas barrier layer comprising a deposition film formed on the planarization layer, wherein the oxygen transmission rate in the gas barrier substrate is 0.3 cc/m$^2$/day or less.

5. A gas barrier substrate having a base material, a planarization layer having a cardo polymer and formed on the base material, and a gas barrier layer comprising a deposition film formed on the planarization layer, wherein the average roughness of the gas barrier substrate is 6 nm or less, and the maximum height difference of surface (peak to valley) is 60 nm or less.

6. A gas barrier substrate having a base material, a planarization layer having a cardo polymer and formed on the base material, and a gas barrier layer comprising a deposition film formed on the planarization layer, wherein a stress releasing layer for releasing the stress applied on the base material is formed on the opposite surface where the gas barrier layer and the planarization layer are formed.

7. A display substrate comprising a transparent electrode layer formed on a gas barrier substrate having a base material, a planarization layer having a cardo polymer and formed on the base material, and a gas barrier layer comprising a deposition film formed on the planarization layer.

* * * * *